(12) United States Patent
Hirayama et al.

(10) Patent No.: US 7,745,015 B2
(45) Date of Patent: Jun. 29, 2010

(54) ORGANIC ELECTROLUMINESCENT DEVICE AND METHOD FOR MANUFACTURING SAME

(75) Inventors: Yasuko Hirayama, Hirakata (JP); Takeshi Sano, Hirakata (JP); Takahisa Sakakibara, Osaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 1005 days.

(21) Appl. No.: 10/505,677

(22) PCT Filed: Mar. 24, 2004

(86) PCT No.: PCT/JP2004/004104

§ 371 (c)(1),
(2), (4) Date: Aug. 25, 2004

(87) PCT Pub. No.: WO2004/089043

PCT Pub. Date: Oct. 14, 2004

(65) Prior Publication Data

US 2005/0147842 A1    Jul. 7, 2005

(30) Foreign Application Priority Data

Mar. 31, 2003  (JP)  ............................. 2003-097308
Feb. 27, 2004  (JP)  ............................. 2004-055397

(51) Int. Cl.
*B05D 5/06*  (2006.01)
*H01J 1/62*  (2006.01)

(52) U.S. Cl. .................. 428/690; 428/917; 313/504; 313/506

(58) Field of Classification Search .................. 257/103, 257/40; 428/690, 917; 313/504, 506
See application file for complete search history.

(56) References Cited

U.S. PATENT DOCUMENTS 6,391,471 B1    5/2002    Hiraoka et al.

(Continued)

FOREIGN PATENT DOCUMENTS

JP    2000-223278 A    8/2000

(Continued)

OTHER PUBLICATIONS

Japanese Office Action, with English Translation, issued in Japanese Patent Application No. JP 2004-055397, mailed on Mar. 25, 2008.
Japanese Office Action, with English Translation, issued in Japanese Patent Application No. 2004-055397, dated on Nov. 27, 2007.

*Primary Examiner*—D. Lawrence Tarazano
*Assistant Examiner*—Camie S Thompson
(74) *Attorney, Agent, or Firm*—McDermott Will & Emery LLP

(57) ABSTRACT

An organic electroluminescent device comprises a plurality of stacked layers of polymeric materials soluble in an organic solvent. As a polymeric material forming a lower layer, a polymeric material is selected having a molecular weight greater than the molecular weight of a polymeric material of a layer to be formed on the lower layer. As an organic solvent for dissolving the polymeric material forming the lower layer, an organic solvent is selected having a dielectric constant greater than the dielectric constant of an organic solvent for dissolving the polymeric material forming an upper layer. With a light emitting layer being the lower layer and an electron transport layer being the upper layer, it is preferable that the electron transport layer includes a polymeric material having hole blocking property. With a light emitting layer being the lower layer and an electron transport layer being the upper layer, it is preferable that the repeating unit of the polymeric material forming the light emitting layer and the repeating unit of the polymeric material forming the electron transport layer include the same chemical structure.

17 Claims, 10 Drawing Sheets

U.S. PATENT DOCUMENTS

| | | |
|---|---|---|
| 6,456,003 B1 | 9/2002 | Mori et al. |
| 6,818,325 B2 * | 11/2004 | Mishima et al. ............. 428/690 |
| 6,853,013 B2 * | 2/2005 | Hirai et al. .................. 257/103 |
| 2002/0041979 A1 | 4/2002 | Taguchi |

FOREIGN PATENT DOCUMENTS

| | | |
|---|---|---|
| JP | 2000-286479 | 10/2000 |
| JP | 2002-105445 A | 4/2002 |
| JP | 2002-299061 A | 10/2002 |
| JP | 2003-045664 | 2/2003 |
| JP | 2003-45664 A | 2/2003 |

* cited by examiner

F I G. 2
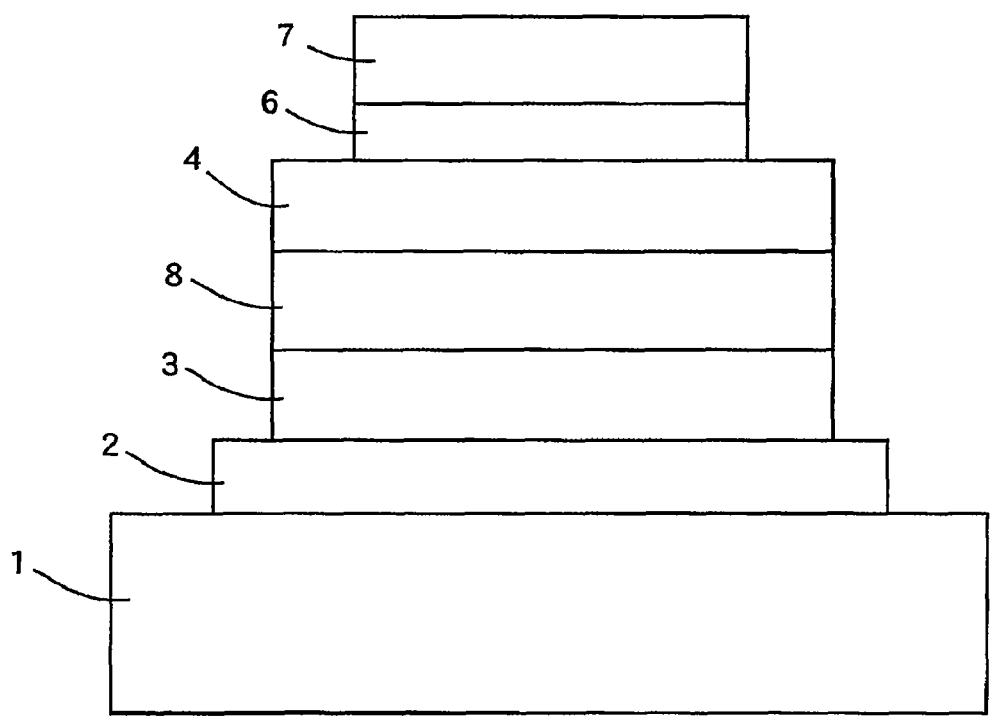

F I G. 4
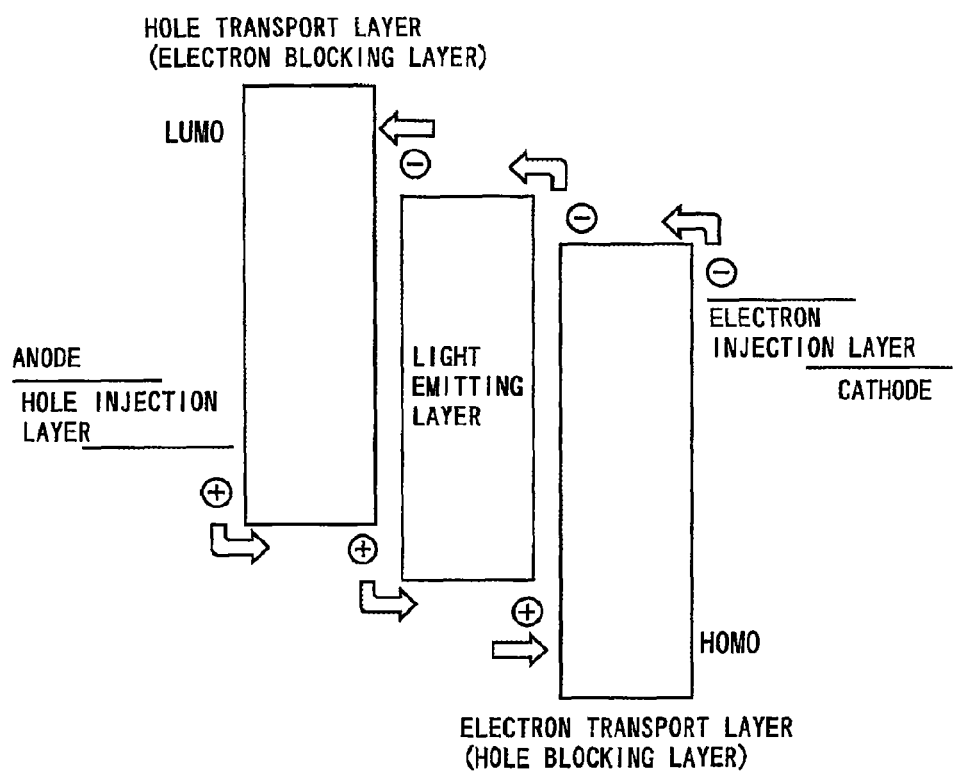

F I G. 6
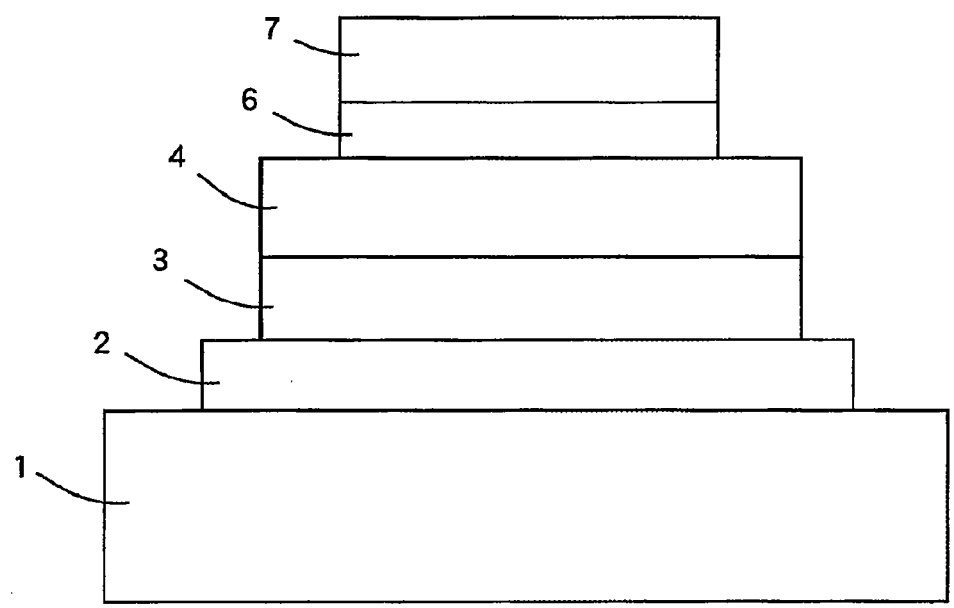

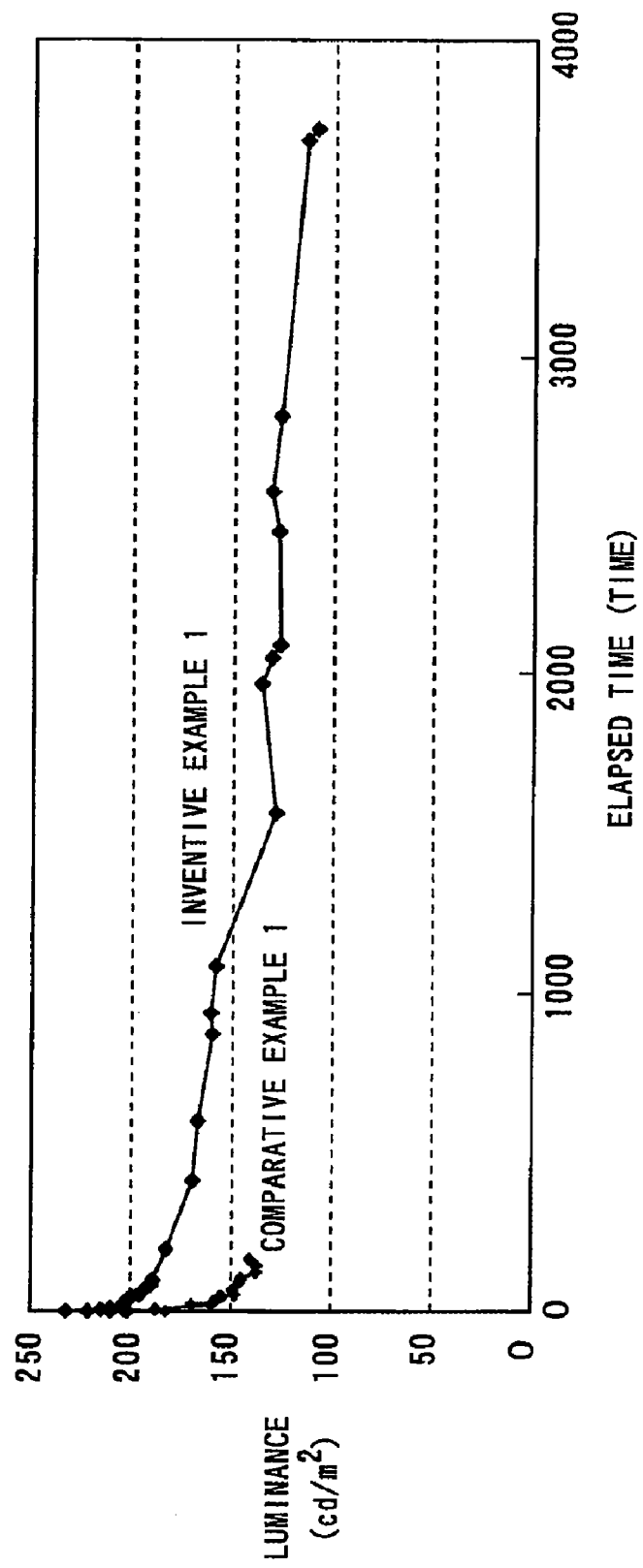
F I G. 7

ORGANIC ELECTROLUMINESCENT DEVICE AND METHOD FOR MANUFACTURING SAME

TECHNICAL FIELD

The present invention relates to an organic electroluminescent device and a method of fabricating the same.

BACKGROUND ART

Conventionally, in a low-molecular organic electroluminescent device, carriers are smoothly injected into a light emitting layer using a multi-layered structure formed with a dry process. In an organic electroluminescent device using polymeric materials, on the other hand, polymer layers are formed with a wet process. With the commonly used wet process, however, a polymer layer serving as a lower layer is subjected to dissolution during the formation of a polymer layer as an upper layer.

For this reason, an organic electroluminescent device of the two-layered structure has been proposed in which two layers, a water-soluble conductive polymer and a luminescent polymer soluble in an organic solvent, are formed. Also proposed is the formation of a stacked structure using two kinds of solvents, a polar solvent and a non-polar solvent.

In addition, a method of fabricating an organic electroluminescent device has been proposed in which an organic material is used as a material of the light emitting layer which is soluble in a solvent having solubility parameters out of the solubility range for the material forming a first organic layer on the side of the substrate, and an organic material is used as a material of a second organic layer formed on the light emitting layer which is soluble in a solvent having solubility parameters out of the solubility range for the material forming the light emitting layer, so as to produce a multi-layered structure (refer to JP 2002-299061 A, for example).

The above-described prior art, however, has yet to provide an organic light emitting device with sufficient luminous efficiency.

DISCLOSURE OF INVENTION

It is an object of the present invention to provide an organic electroluminescent device and a method of fabricating the same which provide sufficient luminous efficiency.

A polymeric material in this specification refers to an organic compound including a repeating unit with a certain molecular weight distribution.

An organic electroluminescent device according to one aspect of the present invention comprises: a substrate; a first electrode; a first organic layer formed by a first polymeric material; a second organic layer formed by a second polymeric material; and a second electrode in this order, the molecular weight of the second polymeric material being smaller than the molecular weight of the first polymeric material.

In the organic electroluminescent device, the first organic layer formed by the first polymeric material and the second organic layer formed by the second polymeric layer are stacked in this order. In the fabrication of this organic electroluminescent device, the first organic layer is formed with a solution of the first polymeric material, the second organic layer is formed on the first organic layer with a solution of the second polymeric material.

In this case, since the molecular weight of the second polymeric material is smaller than that of the first polymeric material, the dissolution of the first polymeric material in the first organic layer into the solution of the second polymeric material is suppressed. This suppresses influence on the first organic layer in the formation of the second organic layer. As a result, an organic electroluminescent device having high luminous efficiency is achieved.

The first organic layer may have luminescent property, and the second organic layer may have carrier transport property.

In this case, with the first organic layer emitting light, the second organic layer promotes carrier transport into the first organic layer. This improves luminous efficiency.

The second polymeric material may have a property of transporting carriers of a first electric charge as well as a property of blocking carriers of a second electric charge opposite to the first electric charge.

In this case, the carriers of the first electric charge in the second organic layer are efficiently transported to the first organic layer while the carriers of the second electric charge injected into the first organic layer are prevented from passing through the first organic layer. This allows efficient recombination of the carriers of the first electric charge and the carriers of the second electric charge in the first organic layer. As a result, luminous efficiency is further improved.

The first organic layer may have carrier transport property, and the second organic layer may have luminescent property.

In this case, the first organic layer promotes carrier transport into the second organic layer with the second organic layer emitting light. This improves luminous efficiency.

The first polymeric material may have a property of transporting carriers of a first electric charge as well as a property of blocking carriers of a second electric charge opposite to the first electric charge.

In this case, the carriers of the first electric charge in the first organic layer are efficiently transported to the second organic layer while the carriers of the second electric charge injected into the second organic layer are prevented from passing through the second organic layer. This allows efficient recombination of the carriers of the first electric charge and the carriers of the second electric charge in the second organic layer. As a result, luminous efficiency is further improved.

The ratio of the molecular weight of the first polymeric material to the molecular weight of the second polymeric material is preferably not less than 3.5.

In this case, the dissolution of the first organic layer in the formation of the second organic layer can sufficiently be suppressed. This further improves luminous efficiency.

The ratio of the molecular weight of the first polymeric material to the molecular weight of the second polymeric material is more preferably not less than 6.2.

In this case, the dissolution of the first organic layer in the formation of the second organic layer can be suppressed more sufficiently. This further improves luminous efficiency.

The repeating unit of the first polymeric material and the repeating unit of the second polymeric material may include a common chemical structure. In this case, the repeating unit of the first polymeric material and the repeating unit of the second polymeric material include a common chemical structure, so that a chemical affinity between the first and second polymeric materials on the interface between the first and second organic layers increases, resulting in satisfactory packing.

Moreover, since it is assumed that the common chemical structure portions of the respective first and second polymeric materials have a similar electronic structure, carrier injection barrier is decreased at a portion where the common chemical structures of the first and second polymeric materials are close to each other on the interface between the first and second organic layers, resulting in smooth carrier migration between the first and second organic layers. This improves luminous efficiency and luminescent life.

The first polymeric material may include a plurality of kinds of polymeric materials. In this case, selecting a plurality of kinds of polymeric materials enables adjustment of luminescent colors in the light emitting layer with improved luminous efficiency and reliability.

The second polymeric material may include a plurality of kinds of polymeric materials. In this case, selecting a plurality of kinds of polymeric materials results in improved luminous efficiency and reliability.

A method of fabricating an organic electroluminescent device according to another aspect of the present invention, comprising a first organic layer and a second organic layer between a first electrode and a second electrode, comprises the steps of: preparing a solution of a first polymeric material by dissolving a first polymeric material in a first organic solvent; preparing a solution of a second polymeric material by dissolving a second polymeric material having a molecular weight smaller than the molecular weight of the first polymeric material in a second organic solvent; forming the first organic layer using the solution of the first polymeric material; and forming the second organic layer on the first organic layer using the solution of the second polymeric material.

In the method of fabricating an organic electroluminescent device, the solution of the first polymeric material is prepared by dissolving the first polymeric material into the first organic solvent, and the solution of the second polymeric material is prepared by dissolving the second polymeric material into the second organic solvent. The first organic layer is formed using the solution of the first polymeric material, and the second organic layer is formed using the solution of the second polymeric material.

In this case, since the molecular weight of the second polymeric material is smaller than that of the first polymeric material, the dissolution of the first polymeric material in the first organic layer into the solution of the second polymeric material is suppressed. This suppresses influence on the first organic layer in the formation of the second organic layer. As a result, an organic electroluminescent device having high luminous efficiency is achieved.

The dielectric constant of the first organic solvent is preferably greater than the dielectric constant of the second organic solvent.

In this case, the dissolution of the first organic layer in the formation of the second organic layer can be suppressed.

The dielectric constants of the first organic solvent and second organic solvent preferably have a difference of not less than two.

In this case, the dissolution of the first organic layer in the formation of the second organic layer can be further suppressed.

The first organic layer may have luminescent property, and the second organic layer may have carrier transport property.

In this case, with the first organic layer emitting light, the second organic layer promotes carrier transport into the first organic layer. This improves luminous efficiency.

The second polymeric material may have a property of transporting carriers of a first electric charge as well as a property of blocking carriers of a second electric charge opposite to the first electric charge.

In this case, the carriers of the first electric charge in the second organic layer are efficiently transported to the first organic layer while the carriers of the second electric charge injected into the first organic layer are prevented from passing through the first organic layer. This allows efficient recombination of the carriers of the first electric charge and the carriers of the second electric charge in the first organic layer. As a result, luminous efficiency is further improved.

The first organic layer may have carrier transport property, and the second organic layer may have luminescent property.

In this case, the first organic layer promotes carrier transport into the second organic layer with the second organic layer emitting light. This improves luminous efficiency.

The first polymeric material may have a property of transporting carriers of a first electric charge as well as a property of blocking carriers of a second electric charge opposite to the first electric charge.

In this case, the carriers of the first electric charge in the first organic layer are efficiently transported to the second organic layer while the carriers of the second electric charge injected into the second organic layer are prevented from passing through the second organic layer. This allows efficient recombination of the carriers of the first electric charge and the carriers of the second electric charge in the second organic layer. As a result, luminous efficiency is further improved.

The ratio of the molecular weight of the first polymeric material to the molecular weight of the second polymeric material is preferably not less than 3.5.

In this case, the dissolution of the first organic layer in the formation of the second organic layer can sufficiently be suppressed. This improves luminous efficiency.

The ratio of the molecular weight of the first polymeric material to the molecular weight of the second polymeric material is more preferably not less than 6.2.

In this case, the dissolution of the first organic layer in the formation of the second organic layer can be suppressed more sufficiently. This further improves luminous efficiency.

The repeating unit of the first polymeric material and the repeating unit of the second polymeric material may include a common chemical structure. In this case, the repeating unit of the first polymeric material and the repeating unit of the second polymeric material include a common chemical structure, so that a chemical affinity between the first and second polymeric materials on the interface between the first and second organic layers increases, resulting in satisfactory packing.

Moreover, since it is assumed that the common chemical structure portions of the respective first and second polymeric materials have a similar electronic structure, carrier injection barrier is decreased at a portion where the common chemical structures of the first and second polymeric materials are close to each other on the interface between the first and second organic layers, resulting in smooth carrier migration between the first and second organic layers. This improves luminous efficiency and luminescent life.

The first polymeric material may include a plurality of kinds of polymeric materials. In this case, selecting a plurality of kinds of polymeric materials enables adjustment of luminescent colors in the light emitting layer with improved luminous efficiency and reliability.

The second polymeric material may include a plurality of kinds of polymeric materials. In this case, selecting a plurality of kinds of polymeric materials results in improved luminous efficiency and reliability.

According to the present invention, since the molecular weight of the second polymeric material is smaller than that of the first polymeric material, the dissolution of the first polymeric material in the first organic layer into the solution of the second polymeric material is suppressed. This suppresses influence on the first organic layer in the formation of the second organic layer. As a result, an organic electroluminescent device having high luminous efficiency is achieved.

BRIEF DESCRIPTION OF DRAWINGS

FIG. 2 is a schematic diagram of an organic electroluminescent device according to a second embodiment of the present invention;

FIG. 4 is a schematic diagram showing energy levels of the lowest unoccupied molecular orbital (LUMO) and the highest occupied molecular orbital (HOMO) in the hole injection layer, hole transport layer, light emitting layer, electron transport layer, and electron injection layer of the organic electronluminescent device;

FIG. 6 is a schematic cross section of an organic electroluminescent device of Comparative Example 1;

FIG. 7 is a diagram showing results of reliability tests;

BEST MODE FOR CARRYING OUT THE INVENTION

Figure 1:
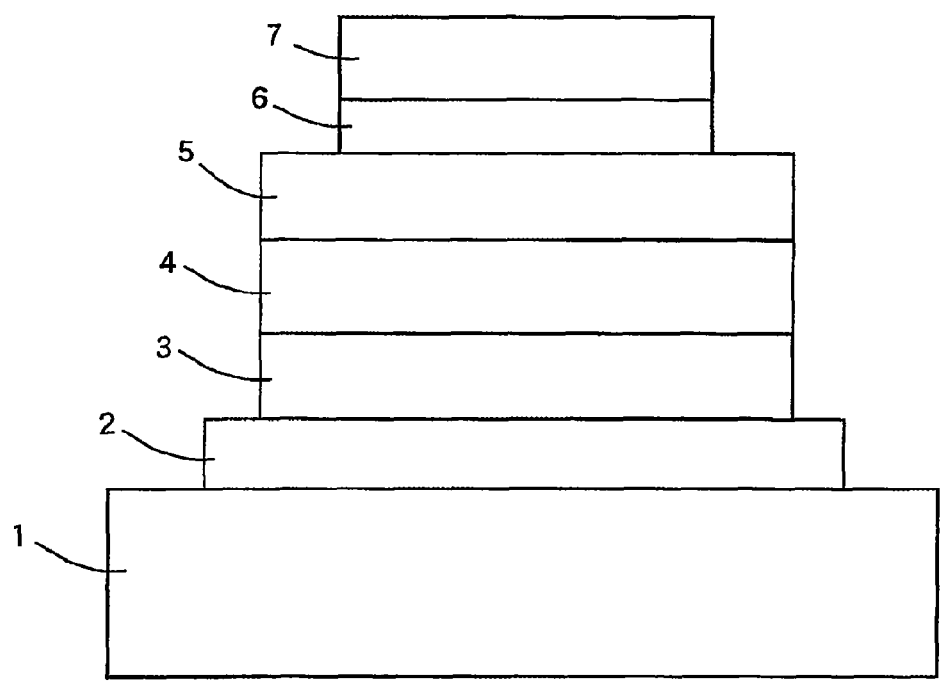
FIG. 1 is a schematic cross section of an organic electroluminescent device according to a first embodiment of the present invention.

FIG. 1 is a schematic cross section of an organic electroluminescent device according to a first embodiment of the present invention. Molecular weight below is expressed in the commonly used weight average.

The organic electroluminescent device of FIG. 1 has a stacked structure including an anode (hole injection electrode) 2, a hole injection layer 3, a light emitting layer 4, an electron transport layer 5, an electron injection layer 6, and a cathode (electron injection electrode) 7 formed in this order on a substrate 1.

The substrate 1 is a transparent electrode made of a glass, plastic or the like. The anode 2 is a transparent or semi-transparent electrode made of a metal compound such as ITO (Indium Tin Oxide) or the like, a metal such as silver, or an alloy.

The hole injection layer 3 is made of a water-soluble conductive polymeric material, for example. The light emitting layer 4 is made of a luminescent polymeric material soluble in an organic solvent. The electron transport layer 5 is made of a polymeric material soluble in an organic solvent and having electron transport property.

The electron injection layer 6 is made of calcium, for example. The cathode 7 is made of a metal such as aluminum or an alloy, for example.

As the polymeric material forming the light emitting layer 4, a polymeric material having a greater molecular weight than that of the polymeric material forming the electron transport layer 5 is selected. As the polymeric material forming the electron transport layer 5, on the other hand, a polymeric material having a smaller molecular weight than that of the polymeric material forming the light emitting layer 4 is selected.

In this case, it is preferable that the ratio of the molecular weight of the polymeric material forming the light emitting layer 4 to that of the polymeric material forming the electron transport layer 5 is not less than 3.5. This suppresses the dissolution of a lower layer, i.e., the light emitting layer 4, during the formation of the electron transport layer 5. As a result, the luminous efficiency is improved.

It is more preferable that the ratio of the molecular weight of the polymeric material forming the light emitting layer 4 to that of the polymeric material forming the electron transport layer 5 is not less than 6.2. This further suppresses the dissolution of the lower layer, the light emitting layer 4, during the formation of the electron transport layer 5. As a result, the luminous efficiency is further improved.

As an organic solvent for dissolving the polymeric material forming the light emitting layer 4, an organic solvent having a greater dielectric constant than that of the organic solvent for dissolving the polymeric material forming the electron transport layer 5 is selected. As an organic solvent for dissolving the polymeric material forming the electron transport layer 5, an organic solvent having a smaller dielectric constant than that of the organic solvent for dissolving the polymeric material forming the light emitting layer 4 is selected. This suppresses the dissolution of the lower layer, the light emitting layer 4, during the formation of the electron transport layer 5.

It is preferable that a difference between the dielectric constant of the organic solvent for dissolving the polymeric material forming the light emitting layer 4 and the dielectric constant of the organic solvent for dissolving the polymeric material forming the electron transport layer 5 is not less than 0.2. The difference is more preferably not less than two. This sufficiently suppresses the dissolution of the lower layer, the light emitting layer 4, during the formation of the electron transport layer 5.

It is preferable that the light emitting layer 4 includes two or more kinds of polymeric materials. In this case, luminescent colors can be adjusted, while improved luminous efficiency and reliability are achieved. It is also preferable that the electron transport layer 5 includes two or more kinds of polymeric materials. This results in improved luminous efficiency and reliability.

Further, it is preferable that the electron transport layer 5 includes a polymeric material having hole blocking property. This prevents holes injected from the side of the anode 2 into the light emitting layer 4 from passing through the light emitting layer 4. As a result, the electrons and holes are allowed to recombine efficiently in the light emitting layer 4, leading to further improved luminous efficiency.

It is also preferable that the repeating unit of the polymeric material forming the light emitting layer 4 and the repeating unit of the polymeric material forming the electron transport layer 5 include the same chemical structure. This further improves luminous efficiency.

Examples of a luminescent polymeric material forming the light emitting layer 4 and a polymeric material forming the electron transport layer 5 will later be mentioned.

A low-molecular material may be added to the polymeric material forming the electron transport layer 5. Examples of a low-molecular material to be added to the polymeric material forming the electron transport layer 5 will later be mentioned. A low-molecular material may be used as the material forming the electron transport layer 5.

FIG. 2 is a schematic cross section of an organic electroluminescent device according to a second embodiment of the present invention. Molecular weight below is expressed in the commonly used weight average.

The organic electroluminescent device of FIG. 2 differs from that of FIG. 1 in that it is provided with a hole transport layer 8 between a hole injection layer 3 and a light emitting layer 4 without the provision of an electron transport layer 5.

The hole transport layer 8 is made of a polymeric material soluble in an organic solvent and having electron transport property. The light emitting layer 4 is made of a luminescent polymeric material soluble in an organic solvent.

As the polymeric material forming the hole transport layer 8, a polymeric material having a greater molecular weight than that of the polymeric material forming the light emitting layer 4 is selected. As the polymeric material forming the light emitting layer 4, on the other hand, a polymeric material having a smaller molecular weight than that of the polymeric material forming the hole transport layer 8 is selected.

In this case, it is preferable that the ratio of the molecular weight of the polymeric material forming the hole transport layer 8 to that of the polymeric material forming the light emitting layer 4 is not less than 3.5. This suppresses the dissolution of the hole transport layer 8 serving as a lower layer during the formation of the light emitting layer 4. As a result, the luminous efficiency is improved.

It is more preferable that the ratio of the molecular weight of the polymeric material forming the hole transport layer 8 to that of the polymeric material forming the light emitting layer 4 is not less than 6.2. This further suppresses the dissolution of the lower layer, i.e., the hole transport layer 8, during the formation of the light emitting layer 4. As a result, the luminous efficiency is further improved.

As the organic solvent for dissolving the polymeric material forming the hole transport layer 8, an organic solvent having a greater dielectric constant than that of the organic solvent for dissolving the polymeric material forming the light emitting layer 4 is selected. As the organic solvent for dissolving the polymeric material forming the light emitting layer 4, an organic solvent having a smaller dielectric constant than that of the organic solvent for dissolving the polymeric material forming the hole transport layer 8 is selected. This suppresses the dissolution of the lower layer, the hole transport layer 8, during the formation of the light emitting layer 4.

It is preferable that a difference between the dielectric constant of the organic solvent for dissolving the polymeric material forming the hole transport layer 8 and the dielectric constant of the organic solvent for the polymeric material forming the light emitting layer 4 is not less than 0.2. The difference is more preferably not less than two. This sufficiently suppresses the dissolution of the lower layer, the hole transport layer 8, during the formation of the light emitting layer 4.

It is preferable that the light emitting layer 4 includes two or more kinds of polymeric materials. In this case, luminescent colors can be adjusted while improved luminous efficiency and reliability are achieved. It is also preferable that the hole transport layer 8 includes two or more kinds of polymeric materials. This results in improved luminous efficiency and reliability.

Further, it is preferable that the hole transport layer 8 includes a polymeric material having electron blocking property. This prevents electrons injected from the side of the cathode 7 into the light emitting layer 4 from passing through the light emitting layer 4. As a result, the electrons and holes are allowed to recombine efficiently in the light emitting layer 4, leading to further improved luminous efficiency.

It is also preferable that the repeating unit of the polymeric material forming the hole transport layer 8 and the repeating unit of the polymeric material forming the light emitting layer 4 include the same chemical structure. This further improves luminous efficiency.

Examples of a polymeric material forming the hole transport layer 8 will later be mentioned. A low-molecular material may be added to the polymeric material forming the hole transport layer 8. Examples of a low-molecular material to be added to the polymeric material forming the hole transport layer 8 will later be mentioned. A low-molecular material may alternatively be used as the material forming the hole transport layer 8.

Figure 3:
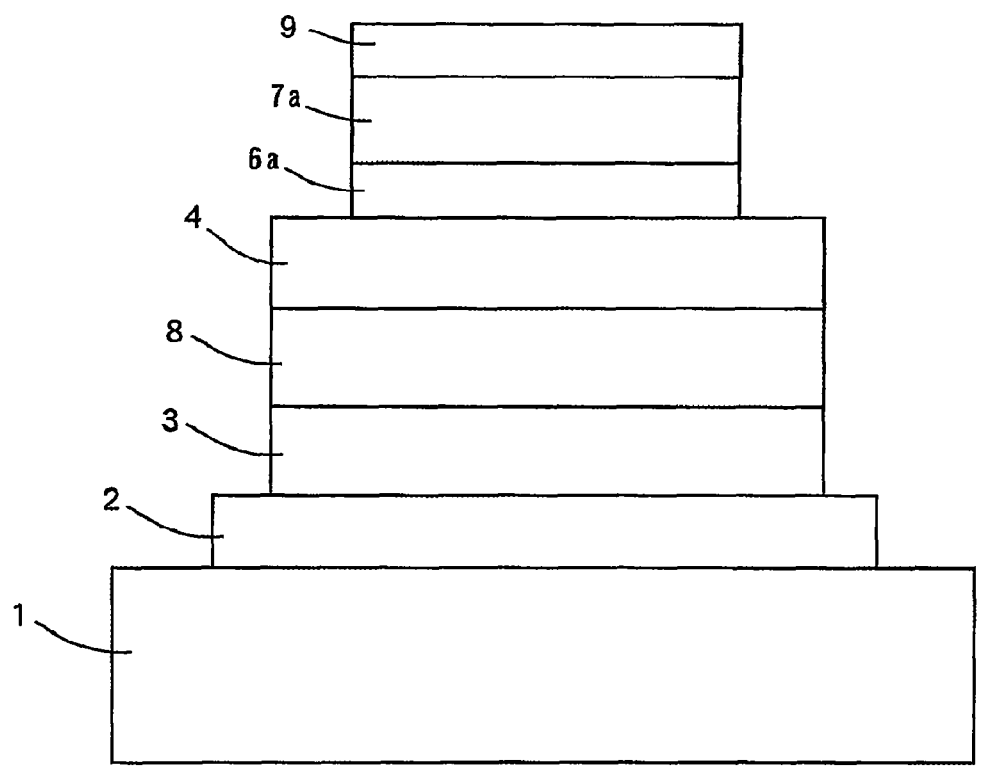
FIG. 3 is a schematic diagram of an organic electroluminescent device according to a third embodiment of the present invention.

FIG. 3 is a schematic cross section of an organic electroluminescent device according to a third embodiment of the present invention.

The organic electroluminescent device of FIG. 3 differs from that of FIG. 2 in that it is provided with an electron injection layer 6a and a cathode (electron injection electrode) 7a instead of the electron injection layer 6 and the cathode (electron injection electrode) 7, and additionally a protective layer 9 on the cathode 7a.

The electron injection layer 6a is made of a compound containing an alkali metal such as lithium fluoride. The cathode 7a is made of calcium, for example. The protective layer 9 is made of a metal such as aluminum or an alloy, for example.

The organic electroluminescent device according to this embodiment with an alkali metal contained in the electron injection layer 6a exhibits improved electron injection property. This leads to high luminous efficiency.

Note that a variety of structures may be used for the organic electroluminescent device according to the present invention without being limited to those shown in FIGS. 1 to 3. For example, both of the electron transport layer 5 and the hole transport layer 8 may be provided as a carrier transport layer (Materials of Light Emitting Layer 4)

<MEH-PPV>

As a polymeric material forming the light emitting layer 4, poly[2-methoxy-5-(2-ethylhexyloxy)-1,4-phenylene-vinylene] (hereinafter referred to as MEH-PPV) having a molecular structure represented by the formula (A1) below may be used. MEH-PPV has a molecular weight of 750,000.

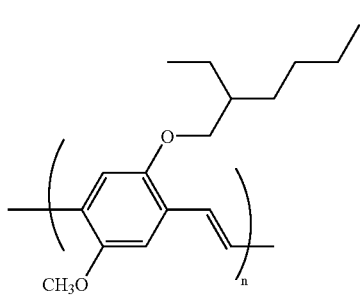

(A1)

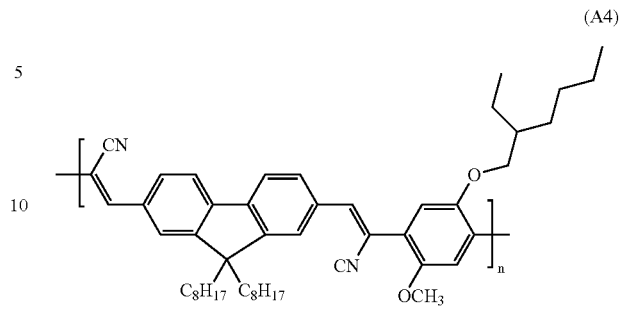

(A4)

<PF8-PAV>

As a polymeric material forming the light emitting layer 4, poly[(9,9-dioctylfluorene-2,7-diyl)-alt-(9,10-divinylene-anthracene)] (hereinafter referred to as PF8-PAV) having a molecular structure represented by the formula (A2) below may be used. PF8-PAV has a molecular weight of 75,000.

<PF6-CVAP>

As a polymeric material forming the light emitting layer 4, poly[(9,9-dihexylfluorene-2,7-diyl)-alt-{2,5-bis(N,N'-diphenylamino)-1,4-bis(1-cyanovinylene)phenylene}] (hereinafter referred to as PF6-CVAP) having a molecular structure represented by the formula (A5) below may be used. PF6-CVAP has a molecular weight of 57,000.

(A2)

(A5)

<PF8-MEHPPV>

As a polymeric material forming the light emitting layer 4, poly[(9,9-dioctylfluorene-2,7-diyl)-alt-{2-methoxy-5-(2-ethylhexyloxy)-1,4-divinylene-phenylene}] (hereinafter referred to as PF8-MEHPPV) having a molecular structure represented by the formula (A3) below may be used. PF8-MEHPPV has a molecular weight of 86,000.

<Cz-CNMEHPPV>

As a polymeric material forming the light emitting layer 4, poly[(9-ethylcarbazole-3,6-diyl)-alt-{2-methoxy-5-(2-ethylhexylox)}-1,4-bis(1-cyanovinylene)phenylene]] (hereinafter referred to as Cz-CNMEHPPV) having a molecular structure represented by the formula (A6) below may be used. Cz-CNMEHPPV has a molecular weight of 11,000.

(A3)

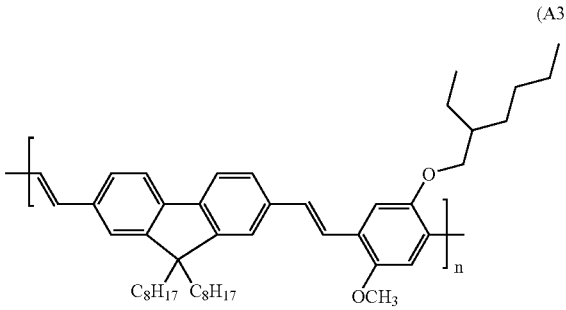

(A6)

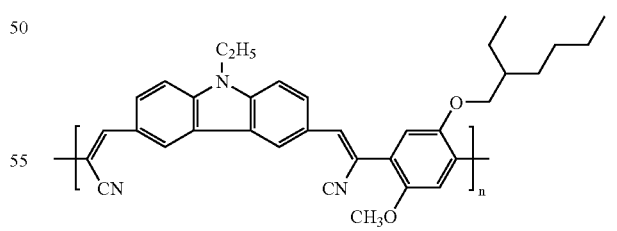

<PF8-CNMEHPPV>

As a polymeric material forming the light emitting layer 4, poly[(9,9-dioctylfluorene-2,7-diyl)-alt-{2-methoxy-5-(2-ethylhexyloxy)-1,4-bis(1-cyanovinylene)phenylene}] (hereinafter referred to as PF8-CNMEHPPV) having a molecular structure represented by the formula (A4) below may be used. PF8-CNMEHPPV has a molecular weight of 59,000.

<BDPAP-CNMEHPPV>

As a polymeric material forming the light emitting layer 4, poly[{2,5-bis (N,N'-diphenylamino)benz-1,4-diyl}-alt-{2-methoxy-5-(2-ethylhexyloxy)-1,4-bis(1-cyanovinylene) phenylene}] (hereinafter referred to as BDPAP-CNMEH-PPV) having a molecular structure represented by the formula (A7) below may be used. BDPAP-CNMEHPPV has a molecular weight of 30,000.

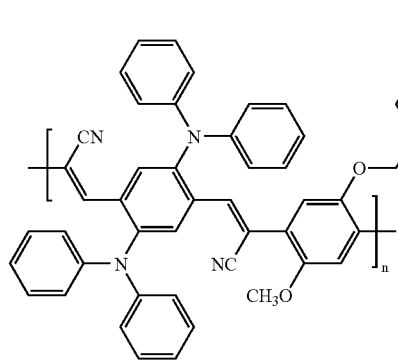

(A7)

<CN-PPP>

As a polymeric material forming the light emitting layer 4, poly[2-(6-cyano-6-methylheptyloxy)-1,4-phenylene] (hereinafter referred to as CN-PPP) having a molecular structure represented by the formula (A8) below may be used. CN-PPP has a molecular weight of 5,000.

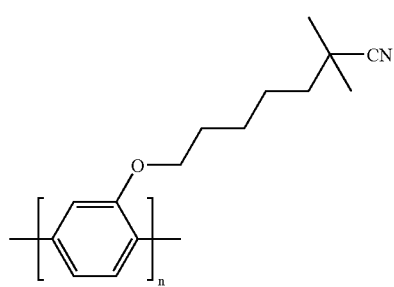

(A8)

<PF8-DMOP>

As a polymeric material forming the light emitting layer 4, poly[(9,9-dioctylfluorene-2,7-diyl)-alt-{1,4-(2,5-dimethoxy)phenylene}] (hereinafter referred to as PF8-DMOP) having a molecular structure represented by the formula (A9) below may be used. PF8-DMOP has a molecular weight of 160,000.

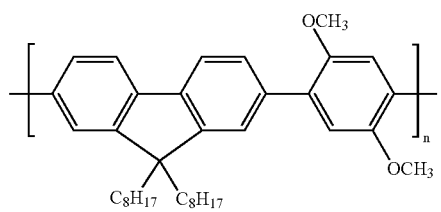

(A9)

<PF8-DSB>

As a polymeric material forming the light emitting layer 4, poly[(9,9-dioctylfluorene-2,7-diyl)-alt-{1,4-distyryl-5-(2-ethylhexyloxy)-2-methoxybenzene}] (hereinafter referred to as PF8-DSB) having a molecular structure represented by the formula (A10) below may be used. PF8-DSB has a molecular weight of 56,000.

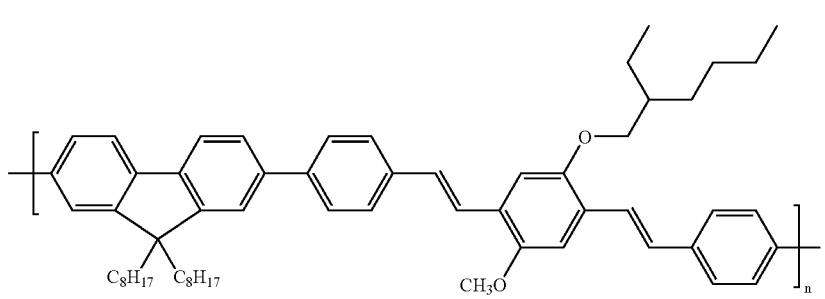

(A10)

<PF6-CNVinyl>

As a polymeric material forming the light emitting layer 4, poly(9,9-dihexylfluorenylene-cyanovinylene) (hereinafter referred to as PF6-CNVinyl) having a molecular structure represented by the formula (A11) below may be used. PF6-CNVinyl has a molecular weight of 420,000.

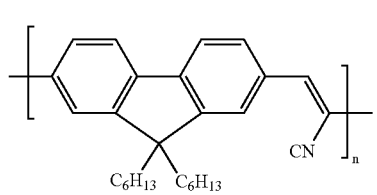

(A11)

<PF8-PPV>

As a polymeric material forming the light emitting layer 4, poly[(9,9-dioctylfluorene-2,7-diyl)-alt-(1,4-divinylene-phenylene)] (hereinafter referred to as PF8-PPV) having a molecular structure represented by the formula (A12) below may be used. PF8-PPV has a molecular weight of 20,000.

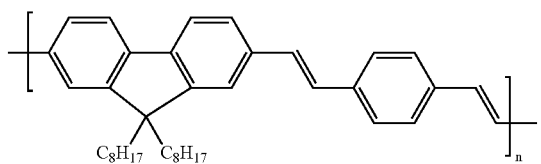

(A12)

<PF8>

As a polymeric material forming the light emitting layer 4, poly(9,9-dioctylfluorene-2,7-diyl) (hereinafter referred to as PF8) having a molecular structure represented by the formula (A13) below may be used. PF8 has a molecular weight of 140,000.

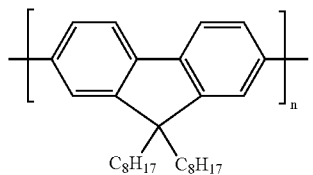

(A13)

<PF6>

As a polymeric material forming the light emitting layer 4, poly(9,9-dihexylfluorene-2,7-diyl) (hereinafter referred to as PF6) having a molecular structure represented by the formula (A14) below may be used. PF6 has a molecular weight of 300,000.

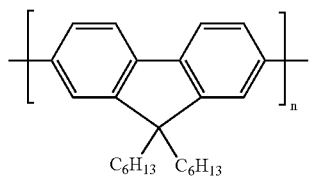

(A14)

<PF6-TPDAB>

As a polymeric material forming the light emitting layer 4, poly[(9,9-dihexylfluorene-2,7-diyl)-alt-{N,N'-bis(4-butyl phenyl)-N,N'-diphenyl-1,4-diaminobenzene}] (hereinafter referred to as PF6-TPDAB) having a molecular structure represented by the formula (A15) below may be used. PF6-TPDAB has a molecular weight of 10,000.

<PF6-Ant>

As a polymeric material forming the light emitting layer 4, poly[(9,9-dihexylfluoren-2,7-diyl)-alt-(9,10-anthracene-9, 10-diyl)] (hereinafter referred to as PF6-Ant) having a molecular structure represented by the formula (A16) below may be used. PF6-Ant has a molecular weight of 65,000.

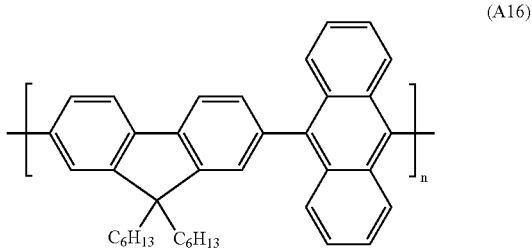

(A16)

<PF6-Cz>

As a polymeric material forming the light emitting layer 4, poly[(9,9-dihexylfluorene-2,7-diyl)-alt-(9-ethylcarbazole-3, 6-diyl)] (hereinafter referred to as PF6-Cz) having a molecular structure represented by the formula (A17) below may be used. PF6-Cz has a molecular weight of 50,000.

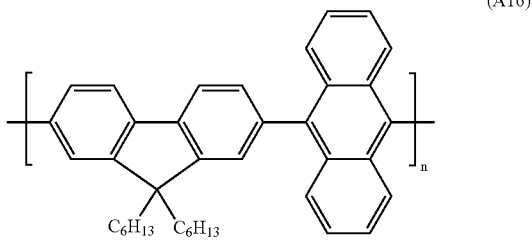

(A17)

<PF6-DAP>

As a polymeric material forming the light emitting layer 4, poly[(9,9-dihexylfluorene-2,7-diyl)-alt-{N,N'-bis(4-buthylphenyl)-1,4-diaminobenzene}] (hereinafter referred to as PF6-DAP) having a molecular structure represented by the formula (A18) below may be used. PF6-DAP has a molecular weight of 40,000.

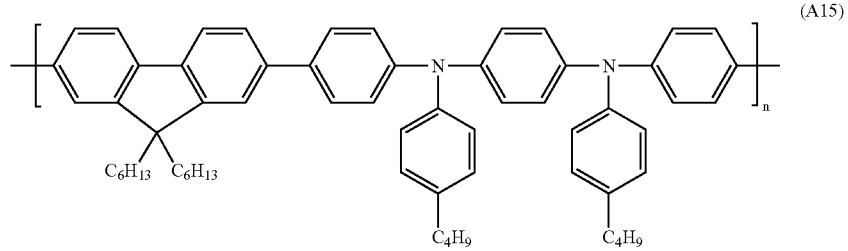

(A15)

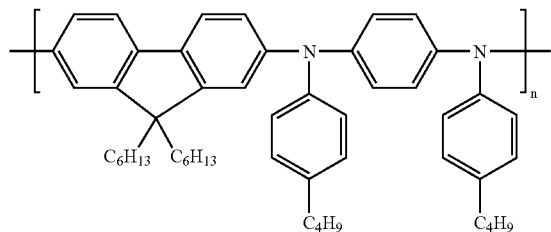

(A18)

<Poly-TPD>

As a polymeric material forming the light emitting layer 4, poly[N,N'-bis(4-buthylphenyl)-N,N'-diphenyl-1,1'-biphenyl-4,4'-diamine] (hereinafter referred to as Poly-TPD) having a molecular structure represented by the formula (A19) below may be used. Poly-TPD has a molecular weight of 29,000.

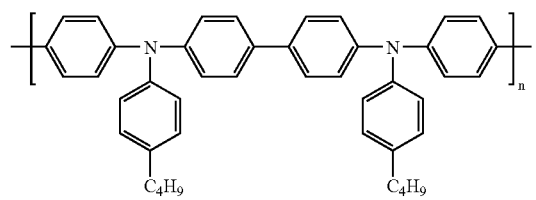

(A19)

<PF8-Bpy>

As a polymeric material forming the light emitting layer 4, poly[(9,9-dioctylfluorene-2,7-diyl)-alt-[(2,2'-bipyridine)-6,6'-diyl]] (hereinafter referred to as PF8-Bpy) having a molecular structure represented by the formula (A20) below may be used. PF8-Bpy has a molecular weight of 10,000.

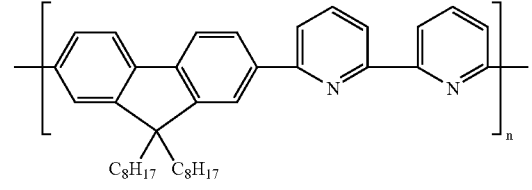

(A20)

<PF8-Cz>

As a polymeric material forming the light emitting layer 4, poly[(9,9-dioctylfluorene-2,7-diyl)-alt-(9-butylcarbazole-3,6-diyl)] (hereinafter referred to as PF8-Cz) having a molecular structure represented by the formula (A21) below may be used. PF8-Cz has a molecular weight of 32,000.

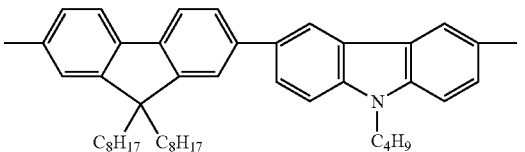

(A21)

<PVCz>

As a polymeric material forming the light emitting layer 4, poly(N-vinylcarbazole) (hereinafter referred to as PVCz) having a molecular structure represented by the formula (A22) below may be used. PVCz has a molecular weight of 1,000,000.

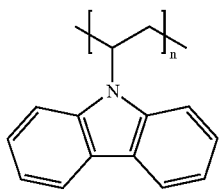

(A22)

<PF8-SB (10%)>

As a polymeric material forming the light emitting layer 4, poly[(9,9-dioctylfluorene-2,7-diyl)-co-(styrylbenzene)-4,4'-diyl] (90:10) (hereinafter referred to as PF8-SB (10%)) having a molecular structure represented by the formula (A23) below may be used. PF8-SB (10%) has a molecular weight of 860,000.

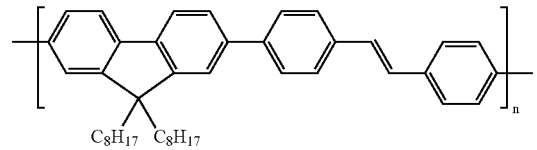

(A23)

<PF8-TPA>

As a polymeric material forming the light emitting layer 4, poly[(9,9-dioctylfluorene-2,7-diyl)-alt-(triphenylamine-4,4'-diyl)] (hereinafter referred to as PF8-TPA) having a molecular structure represented by the formula (A24) below may be used. PF8-TPA has a molecular weight of 50,000.

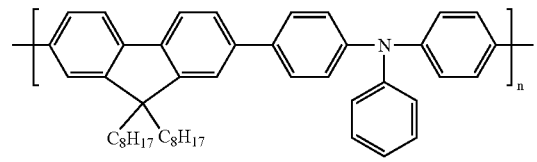

(A24)

<PF8-TPD>

As a polymeric material forming the light emitting layer 4, poly[(9,9-dioctylfluorene-2,7-diyl)-alt-{N,N'-bis(4-tert-butylphenyl)-N,N'-diphenyl-1,1'-biphenyl-4,4'-diamine}] (hereinafter referred to as PF8-TPD) having a molecular structure represented by the formula (A25) below may be used. PF8-TPD has a molecular weight of 230,000.

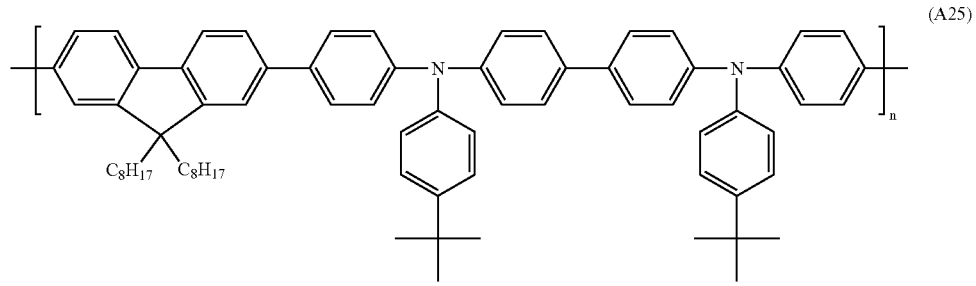

(A25)

<PF8-BT (10%)>

As a polymeric material forming the light emitting layer 4, poly[(9,9-dioctylfluorene-2,7-diyl)-co-(benzothiazole-4,7-diyl)] (90:10) (hereinafter referred to as PF8-BT (10%)) having a molecular structure represented by the formula (A26) below may be used. PF8-BT (10%) has a molecular weight of 440,000.

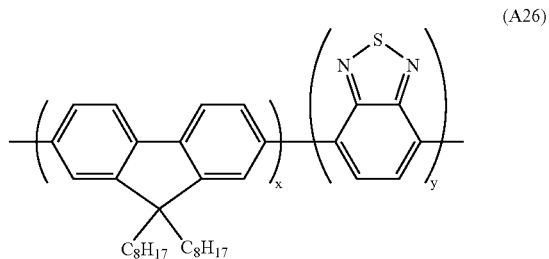

(A26)

<PF8-Py>

As a polymeric material forming the light emitting layer 4, poly[(9,9-dioctylfluorene-2,7-diyl)-alt-(pyridine-2,6-diyl)] (hereinafter referred to as PF8-Py) having a molecular structure represented by the formula (A27) below may be used. PF8-Py has a molecular weight of 97,000.

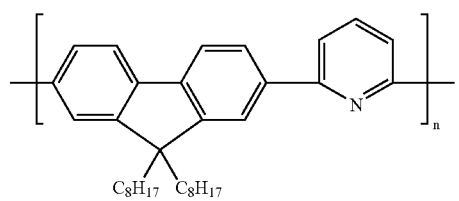

(A27)

Other luminescent polymeric materials may be used as a polymeric material forming the light emitting layer 4 without limited to the examples shown above. Note that a mixture of two or more kinds of polymeric materials may form the light emitting layer 4. Alternatively, one or more kinds of low-molecular materials may be added to one or more kinds of polymeric materials.

Mixing three or more kinds of polymeric materials also results in an emission of white light.

Note also that improved reliability may be achieved by the use of a bipolar polymeric material having both the electron accepting property and electron donating property as a polymeric material forming the light emitting layer 4. As such a bipolar polymeric material, PF6-CVAP may be used, for example.

When a polymeric material having a single repeating unit such as MEH-PPV is used as the light emitting layer 4, the light emitting layer 4 becomes unstable by electron injection while being stable in hole injection. In this case, mixing of the bipolar PF6-CVAP into the MEH-PPV may increase the electron accepting property of the light emitting layer 4, resulting in lengthened life of the organic electroluminescent device.

FIG. 4 is a schematic diagram showing energy levels of the lowest unoccupied molecular orbital (LUMO) and the highest occupied molecular orbital (HOMO) in the hole injection layer, hole transport layer, light emitting layer, electron transport layer, and electron injection layer of the organic electronluminescent device.

In FIG. 4, electrons are transported from the cathode through the electron injection layer and the electron transport layer into the light emitting layer. Holes are transported from the anode through the hole injection layer and the hole transport layer into the light emitting layer. In this case, the electrons are blocked at a high LUMO level in the hole transport layer. The holes are blocked at a low HOMO level in the electron transport layer. This facilitates electron-hole bond in the light emitting layer.

When a mixture of two luminescent polymeric materials having different bandgaps represented by energy difference between the HOMO and the LUMO is used for the light emitting layer, emission is obtained normally from the luminescent polymeric material with a smaller bandgap. At the time, the polymeric material with a smaller bandgap undergoes energy transfer from the polymeric material without emission, which results in higher luminous efficiency.

Table 1 shows a list of luminescent colors, luminescence peak wavelengths, absorption peak wavelengths, HOMO levels, bandgaps, LUMO levels, and molecular weights for the above-mentioned polymeric materials forming the light emitting layer 4.

TABLE 1

| ABBRIVIATED NAME | LUMINESCENT COLOR | LUMINESCENCE PEAK WAVELENGTH (nm) | ABSORPTION PEAK WAVELENGTH (nm) | HOMO (eV) | BAND GAP | LUMO (eV) | MOLECULAR WEIGHT |
|---|---|---|---|---|---|---|---|
| MEH-PPV | ORANGE | 592 | 521 | −5.17 | −2.09 | −3.08 | 750000 |
| PF8-PAV | ORANGE | 584 | 451 | −5.64 | −2.33 | −3.31 | 75000 |
| PF8-MEHPPV | GREEN | 516 | 450 | −5.4 | −2.4 | −3 | 86000 |
| PF8-CNMEHPPV | YELLOW | 552 | 471 | −5.83 | −2.25 | −3.58 | 59000 |
| PF6-CVAP | RED | 670 | 403 | −5.71 | −2.51 | −3.2 | 57000 |
| Cz-CNMEHPPV | GREEN | 518 | 396 | −5.64 | −2.58 | −3.06 | 11000 |
| BDPAP-CNMEHPPV | RED | 647 | 290 | −5.6 | −2.05 | −3.55 | 30000 |
| CN-PPP | BLUE | 403 | 334 | −5.64 | −3.31 | −2.33 | 5000 |
| PF8-DMOP | BLUE | 418 | 368 | −5.77 | −3.02 | −2.75 | 160000 |
| PF8-DSB | GREEN | 516 | 421 | −5.57 | −2.51 | −3.06 | 56000 |
| PF6-CNVinyl | GREEN | 502 | 439 | −5.92 | −2.85 | −3.07 | 420000 |
| PF8-PPV | BLUE | 476 | 383 | −5.75 | −2.6 | −3.15 | 20000 |
| PF8 | BLUE | 420 | 370 | −5.7 | −2.91 | −2.79 | 140000 |
| PF6 | BLUE | 424 | 378 | −5.76 | −2.96 | −2.8 | 300000 |
| PF6-TPDAB | BLUE | 477 | 374 | −5.1 | −2.88 | −2.22 | 10000 |
| PF6-Ant | BLUE | 462 | 380 | −5.85 | −2.68 | −3.17 | 65000 |
| PF6-Cz | BLUE | 423 | 356 | −5.42 | −2.99 | −2.43 | 50000 |
| PF6-DAP | BLUE | 430 | 397 | −4.99 | −2.96 | −2.03 | 40000 |
| Poly-TPD | BLUE | 427 | 368 | −5.11 | −2.9 | −2.21 | 29000 |
| PF8-Bpy | BLUE | 404 | 349 | −5.44 | −3.25 | −2.19 | 10000 |
| PF8-Cz | BLUE | 410 | 344 | −5.43 | −3.076 | −2.354 | 32000 |
| PVCz | BLUE | 425 | 276 | −5.54 | −3.44 | −2.1 | 1000000 |
| PF8-SB (10%) | BLUE | 423 | 385 | −5.84 | −2.9 | −2.94 | 860000 |
| PF8-TPA | BLUE | 433 | 381 | −5.48 | −2.9 | −2.58 | 50000 |
| PF8-TPD | BLUE | 433 | 378 | −5.34 | −2.91 | −2.43 | 230000 |
| PF8-BT (10%) | YELLOW | 541 | 368 | −5.77 | −2.43 | −3.34 | 440000 |
| PF8-Py | BLUE | 406 | 348 | −5.79 | −3.2 | −2.59 | 97000 |

Figure 5:
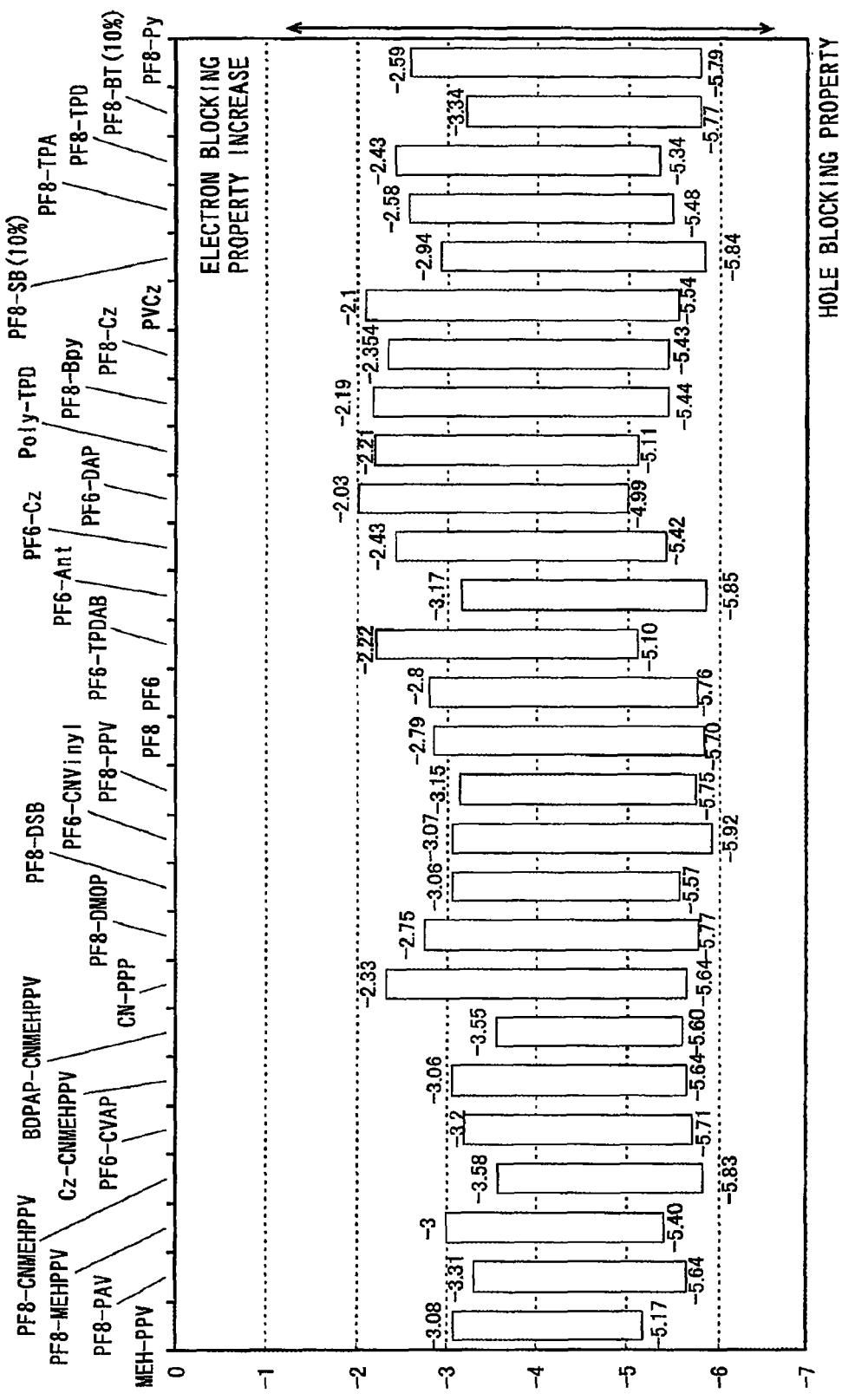
FIG. 5 is a diagram showing LUMO levels and HOMO levels of the polymeric materials forming light emitting layers.

FIG. 5 is a diagram showing LUMO levels and HOMO levels of the polymeric materials forming light emitting layers.

In the first embodiment, a polymeric material will be selected considering the material of the electron transport layer 5 based on the luminescent color, molecular weight, LUMO level, and HOMO level.

In second and third embodiments, polymeric materials will be selected considering the material of the hole transport layer 8 based on the luminescent color, molecular weight, LUMO level, and HOMO level.

(Materials of Electron Transport Layer 5)

A material forming the electron transport layer 5 may be selected from the polymeric materials in above Table 1 considering the polymeric material of the light emitting layer 4. In this case, as the electron transport layer 5, a polymeric material having a lower LUMO level (absolute value of the LUMO level is greater) than that of the light emitting layer 4 is selected. The hole blocking effect increases as the HOMO level of the electron transport layer 5 decreases (absolute value of the HOMO level is greater).

As the electron transport layer 5, PF8-DSB, MEH-PPV, PF8-MEHPPV, PF8, PF8-Py, PF6-Ant, PF6, PF6-CNVinyl, for example, may be used.

Other polymeric materials having electron transport property may be used as a polymeric material forming the electron transport layer 5 without limited to the above-mentioned examples. Note that the polymeric material of the electron transport layer 5 may be a mixture of two or more kinds of polymeric materials. Alternatively, one or more kinds of low-molecular materials may be added to one or more kinds of polymeric materials.

Following are examples of such low-molecular materials (low-molecular materials with electron transport property) to be added to the polymeric material forming the electron transport layer 5.

<ZnPBO>

As a low-molecular additive with electron transport property, zinc bis[2-(o-hydroxyphenyl)benzoxazolate] (hereinafter referred to as ZnPBO) having a molecular structure represented by the following formula (B1) may be used. ZnPBO has a molecular weight of 486.

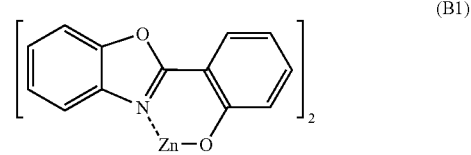

(B1)

<Anthracene>

As a low-molecular additive with electron transport property, anthracene having a molecular structure represented by the following formula (B2) may be used. Anthracene has a molecular weight of 178.

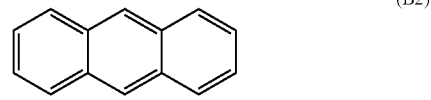

(B2)

<Alq3>

As a low-molecular additive with electron transport property, aluminum tris-(8-quinolinolate) (hereinafter referred to as $Alq_3$) having a molecular structure represented by the following formula (B3) maybe used. $Alq_3$ has a molecular weight of 459.

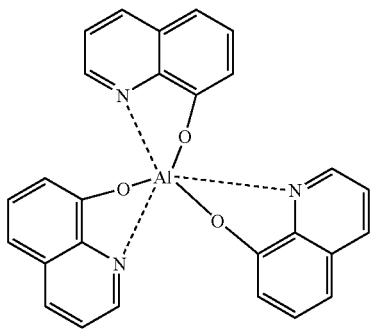

(B3)

<Perylene>

As a low-molecular additive with electron transport property, perylene having a molecular structure represented by the following formula (B4) may be used. Perylene has a molecular weight of 252.

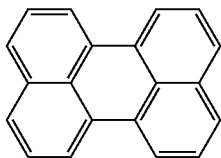

(B4)

<OXD-7>

As a low-molecular additive with electron transport property, 1,3-bis[5-(4-tert-butylphenyl)-1,3,4-oxadizol-2-yl]benzen (hereinafter referred to as OXD-7) having a molecular structure represented by the following formula (B5) may be used. OXD-7 has a molecular weight of 487.

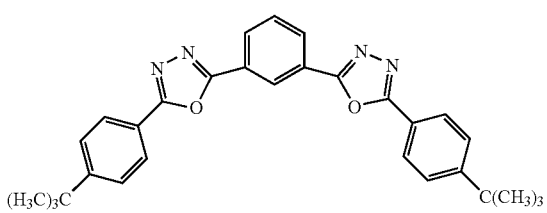

(B5)

(Materials of Hole Transport Layer 8)

A material forming the hole transport layer 8 may be selected from the polymeric materials in above Table 1 considering the polymeric material of the light emitting layer 4. In this case, as the hole transport layer 8, a polymeric material having a higher HOMO level (absolute value of the HOMO level is smaller) than that of the light emitting layer 4 is selected. The effect of electron blocking increases as the LUMO level of the hole transport layer 8 becomes higher (absolute value of the LUMO level is smaller).

As the hole transport layer 8, PF8-SB, PF8-BT, and PVCz, for example, may be used.

Other polymeric materials having hole transport property may be used as the polymeric material forming the hole transport layer 8 without limited to the above-mentioned examples. Note that the polymeric material of the hole transport layer 8 may be a mixture of two or more kinds of polymeric materials. Alternatively, one or more kinds of low-molecular materials may be added to one or more kinds of polymeric materials.

Following are examples of such low-molecular materials (low-molecular materials with hole transport property) to be added to the polymeric material forming the hole transport layer 8.

<TPD>

As a low-molecular additive with hole transport property, N,N'-Bis-(3-methylphenyl)-N,N'-bis-(phenyl)-benzidine (hereinafter referred to as TPD) having a molecular structure represented by the following formula (B6) may be used. TPD has a molecular weight of 570.

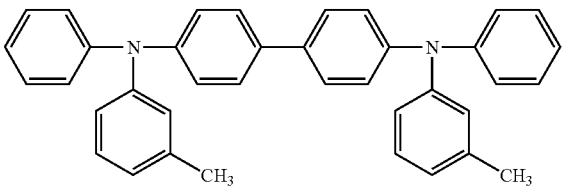

(B6)

<NPB>

As a low-molecular additive with hole transport property, N,N'-Di(naphthalen-1-yl)-N,N'-diphenyl-benzidine (hereinafter referred to as NPB) having a molecular structure represented by the following formula (B7) may be used. NPB has a molecular weight of 644.

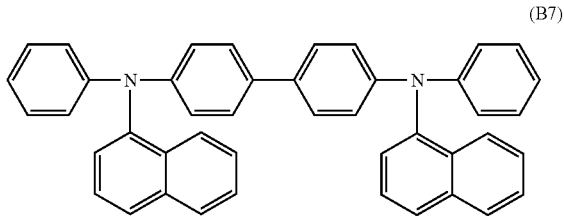

(B7)

Any of the above-mentioned low-molecular materials may be used to form the electron transport layer 5 or hole transport layer 8. As a method of forming the electron transport layer 5 or the hole transport layer 8 using any of the above low-molecular materials, a method in which such a low-molecular material is dissolved in an organic solvent, and a film is formed by a wet process such as spin coating may be used, apart from the common vacuum evaporation. It is preferable to use a wet process, particularly in this embodiment.

As polymeric materials usable for the light emitting layer and the carrier transport layer, polymeric materials synthesized from a single monomer as well as copolymers synthesized from a plurality of monomers may be mentioned.

Table 1 mainly shows the examples of copolymers comprising two kinds of monomers with a 1:1 ratio; however, copolymers using different monomers, copolymers having a monomer composition ratio except 1:1, or copolymers comprising three or more kinds of monomers may also be used.

As a design guideline for a copolymer, a method in which monomers having a similar shape are bonded to the base polymer chemical structure at an appropriate compounding ratio, a method in which monomers assisting in the carrier transport property (electron transport or hole transport property) are bonded at an appropriate compounding ratio, a method in which highly luminescent monomers are bonded at an appropriate compounding ratio, or a method in which monomers having both the carrier transport and luminescent properties are bonded at an appropriate compounding ratio may be used to improve the performance of a polymer material.

With a carrier-transport monomer, when the compounding ratio thereof is in a range of 1 to 70 mol %, particularly in a range of 3 to 50 mol %, the effect of greatly increasing the performance can be obtained.

With a luminescent monomer, when the compounding ratio thereof is in a range of 0.2 to 50 mol %, particularly in a range of 0.5 to 30 mol %, the effect of greatly increasing the performance can be obtained.

As a monomer that expresses the luminescent or carrier property, an aryl group having a pi-electron; an aromatic hydrocarbon compound such as benzene, naphthalene, anthracene, pyrene, naphthacene, triphenylene, perylene, phenanthrene, styrylbenzene, distyrylbenzene, fluorene or biphenyl, or a compound in which any of various substituents is added to any of the above; a heterocyclic compound such as thiophene, benzothiophene, pyrrole, porphyrin, oxazole, benzoxazole, oxadiazole, thiazole, benzthiazole, benzthidiazole, pyrazoline, triazole, siloxane, carbazole, pyridine, phenylpyridine, pyrimidine, pyrazine, triazine, oxazine, quinoline, quinazoline, quinacridone, thiazine, benzofuran, coumarin, chromene, benzofuran, xanthene, thioxanthene, acridine, thionine, phenazine, phenoxazine or phenanthroline, or a compound in which any of various substituents is added to any of the above; a nitrogen-containing compound such as phenylamine, naphthylamine, triphenylamine or azobenzene, or a compound in which any of various substituents is added to the above; or a silicon containing compound such as phenylsilane may be used.

The molecular weight of a polymeric material can be controlled by adjusting reaction conditions (such as reaction temperature, reaction time, monomer compounding ratio, catalyst concentration, raw material concentration, and reaction solvent) at the time of synthesis of materials. Also, undesired substances such as impurities, catalysts, unreacted monomers, and low-molecular weight components can be eliminated by adjusting purification conditions (such as solution separation, column chromatography, and reprecipitation), so that a polymeric material having a certain molecular weight can be obtained.

Note that a mixed solvent of two or more kinds of organic solvents may be used for the formation of the light emitting layer 4.

As an organic solvent used for the formation of the light emitting layer 4, a mixed solvent of one or more kinds selected from hydrocarbons, hydrocarbon halides, nitro-hydrocarbons, and nitrites, such as ethylcellosolve, methylcellosolve, toluene, o-dichlorobenzene, 2,2-dimethylbutane, 2,4-dimethylpentane, 2-methylhexane, 3-methylhexane, 2,2,4-trimethylpentane, 2-methylbutane, 2,2,5-trimethylhexane, 1,1,2-trichloro-1,2,2-trifluoroethane, 1-pentene, 2,2,3-trimethylpentane, 2-methylpentane, n-pentane, trans-2-pentene, 1-hexene, cis-2-penten, 2-chloro-2-methylpropane, 1,1,2,2-tetrachloro-1,2-difluoroethane, 1-heptene, hexane, n-octane, 1-octene, heptane, n-nonane, 1-nonene, n-decane, 1-chloropentane, 1-decene, 2-chlorobutane, benzotrifluoride, methylcyclohexane, methylcyclopentane, 2-chloropropane, mesitylene, 1-chlorobutane, ethylcyclohexane, p-xylene, m-xylene, 2-bromopropane, cyclohexene, cyclopentane, 1-chloropropane, cyclohexane, 2,3-dimethylbutane, o-xylen, tetrachloromethane, hexafluorobenzene, pentachloroethane, 1-chrolo-2-methylpropane, 1,1-dichloroethylene, 1,1,1,2-tetrachloroethane, 1,1,1-trichloroethane, 1-bromopropane, cumene, p-chlorotoluene, diethylsulfide, o-chlorotoluene, p-dichlorobenzene, 1,1-dichloroethane, tetrachloroethylene, m-dichlorobenzene, p-diethylbenzene, m-diethylbenzene, ethylbenzene, trichloroethylene, 3-chloropropene, o-diethylbenzene, o-dichlorobenzene, bromoethane, toluene, chlorobenzene, trichloromethane, fluorobenzene, 1,2-dichloroethylene(trans), 1,1,2,2-tetrachloroethane, 1,2-dichloropropane, benzene, 1,2,3-trichloropropane, styrene, isobutyronitrile, 1,2-dichloroethylene(cis), 1-bromo-2-chloroethane, 1,2-dichloroethane, hexachloroethylene, 1,2-dibromoethane, 1,1,2-trichloroethane, dichloromethane, valeronitrile, thiophene, carbondisulfide, chlorobromomethane, bromobenzene, 2-nitropropane, 1-nitropropane, benzonitrile, and nitroethane may be used.

A mixed solvent of two or more kinds of organic solvents may be used for the formation of the carrier transport layer.

As an organic solvent used for the formation of the carrier transport layer (electron transport layer 5 or hole transport layer 8), a mixed solvent of one or more kinds selected from hydrocarbons, hydrocarbon halides, nitro-hydrocarbons, and nitriles, such as ethylcellosolve, methylcellosolve, toluene, o-dichlorobenzene, 2,2-dimethylbutane, 2,4-dimethylpentane, 2-methylhexane, 3-methylhexane, 2,2,4-trimethylpentane, 2-methylbutane, 2,2,5-trimethylhexane, 1,1,2-trichloro-1,2,2-trifluoroethane, 1-pentene, 2,2,3-trimethylpentane, 2-methylpentane, n-pentane, trans-2-pentene, 1-hexene, cis-2-penten, 2-chloro-2-methylpropane, 1,1,2,2-tetrachloro-1,2-difluoroethane, 1-heptene, hexane, n-octane, 1-octene, heptane, n-nonane, 1-nonene, n-decane, 1-chloropentane, 1-decene, 2-chlorobutane, benzotrifluoride, methylcyclohexane, methylcyclopentane, 2-chloropropane, mesitylene, 1-chlorobutane, ethylcyclohexane, p-xylene, m-xylene, 2-bromopropane, cyclohexene, cyclopentane, 1-chloropropane, cyclohexane, 2,3-dimethylbutane, o-xylen, tetrachloromethane, hexafluorobenzene, pentachloroethane, 1-chrolo-2-methylpropane, 1,1-dichloroethylene, 1,1,1,2-tetrachloroethane, 1,1,1-trichloroethane, 1-bromopropane, cumene, p-chlorotoluene, diethylsulfide, o-chlorotoluene, p-dichlorobenzene, 1,1-dichloroethane, tetrachloroethylene, m-dichlorobenzene, p-diethylbenzene, m-diethylbenzene, ethylbenzene, trichloroethylene, 3-chloropropene, o-diethylbenzene, o-dichlorobenzene, bromoethane, toluene, chlorobenzene, trichloromethane, fluorobenzene, 1,2-dichloroethylene(trans), 1,1,2,2-tetrachloroethane, 1,2-dichloropropane, benzene, 1,2,3-trichloropropane, styrene, isobutyronitrile, 1,2-dichloroethylene(cis), 1-bromo-2-chloroethane, 1,2-dichloroethane, hexachloroethylene, 1,2-dibromoethane, 1,1,2-trichloroethane, dichloromethane, valeronitrile, thiophene, carbondisulfide, chlorobromomethane, bromobenzene, 2-nitropropane, 1-nitropropane, benzonitrile, and nitroethane may be used.

Note that a luminescent color from the light emitting layer 4 can be adjusted by selecting polymeric materials forming the light emitting layer 4.

The light emitting layer 4 may be formed by two light emitting layers emitting different colors, respectively. For example, by using a polymeric material that can emit orange-red light for one of the two light emitting layers, and using a polymeric material that can emit blue light for the other, an emission of white light can be obtained. In this case, the combination of an organic electroluminescent device that can emit white light with red, green, and blue filters allows for a display of three primary colors of light (RGB display), which leads to a full-color display.

Alternatively, an organic electroluminescent device with a light emitting layer emitting green light, an organic electroluminescent device with a light emitting layer emitting orange or red light, and an organic electroluminescent device with a light emitting layer emitting blue light may be used in combination. In this case, by using the organic electroluminescent device emitting orange or red light as a pixel emitting red light (R pixel), the organic electroluminescent device emitting green light as a pixel emitting green light (G pixel), and the organic electroluminescent device emitting blue light as a pixel emitting blue light (B pixel), a display of three primary colors of light (RGB display) can be achieved, leading to a full-color display.

EXAMPLES

In Examples below, organic electroluminescent devices according to the above embodiments were fabricated to evaluate luminescent characteristics and luminescent life.

Inventive Example 1

In Inventive Example 1, an organic electroluminescent device having a three-layered structure as shown in FIG. 1 was fabricated in a following method.

The method of fabricating the organic electroluminescent device according to the Inventive Example 1 will be described. A substrate 1 comprising an anode 2 made of ITO was used. Poly(ethylenedioxythiophene):poly(styrenesulphonate) (a mixture of poly(p-styrenesulfonic acid)salt of [2,3-dihydrothieno(3,4,-b)(1,4)dioxin-5,7-diyl] and poly(p-styrenesulfonic acid)) (hereinafter called PEDOT:PSS) having a molecular structure represented by the formula (C1) below was formed to have a thickness of 40 nm on the anode 2 by spin coating, and baked at 180 degrees for ten minutes in the atmosphere, thus forming a hole injection layer 3.

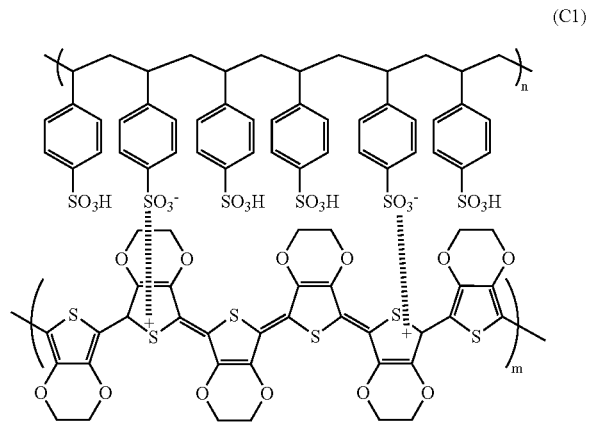

(C1)

Then, MEH-PPV was formed to have a thickness of 40 nm on the hole injection layer 3 by spin coating, and baked at 80 degrees for five minutes in an atmosphere of nitrogen, thus forming a light emitting layer 4. At this time, the MEH-PPV was used as a solution of o-dichlorobenzene (dielectric constant: 6.828).

PF8-DSB was subsequently formed to have a thickness of 40 nm on the light emitting layer 4 by spin coating, thus forming an electron transport layer 5 also serving as a hole blocking layer. At this time, the PF8-DEB was used as a solution of toluene (dielectric constant: 2.283). The electron transport layer 5 was formed without damage to the polymer film of the light emitting layer 4.

An electron injection layer 6 made of calcium having a thickness of 6 nm and a cathode 7 made of aluminum having a thickness of 200 nm were formed on the electron transport layer 5 by vacuum evaporation.

Comparative Example 1

In Comparative Example 1, an organic electroluminescent device having the two-layered structure shown in FIG. 6 was fabricated in a following method.

Similarly in the Inventive Example 1, a substrate 1 comprising an anode 2 made of ITO was used. As with the Inventive Example 1, PEDOT:PSS was initially formed to have a thickness of 40 nm on the anode 2 by spin coating, and baked at 180 degrees for ten minutes in the atmosphere, thus forming a hole injection layer 3.

Then, as with the Inventive Example 1, MEH-PPV was formed to have a thickness of 40 nm on the hole injection layer 3 by spin coating, and baked at 80 degrees for five minutes in an atmosphere of nitrogen, thus forming a light emitting layer 4. At this time, the MEH-PPV was used as a solution of o-dichlorobenzene.

An electron injection layer 6 made of calcium in a thickness of 6 nm and a cathode 7 made of aluminum in a thickness of 200 nm were formed on the light emitting layer 4 by vacuum evaporation.

(Evaluation 1)

The organic electroluminescent devices of the Inventive Example 1 and the Comparative Example 1 were measured for luminous efficiency. Table 2 shows materials of the light emitting layers 4 and the electron transport layers 5, and measurement results of the luminous efficiencies and luminance half-lives for the organic electroluminescent devices of the Inventive Example 1 and the Comparative Example 1.

TABLE 2

|  | LIGHT EMITTING LAYER 4 | ELECTRON TRANSPORT LAYER 5 | LUMINANCE EFFICIENCY (cd/A) at 100 cd/m$^2$ | LUMINANCE HALF-LIFE |
|---|---|---|---|---|
| INVENTIVE EXAMPLE 1 | MEH-PPV (750,000) (HOMO: −5.17 eV) | PF8-DSB (56,000) (HOMO: −5.57 eV) | 2.6 | NOT LESS TAHN 38000 |
| COMPARATIVE EXAMPLE 1 | MEH-PPV (750,000) (HOMO: −5.17 eV) | — | 0.1 | 400 |

In Table 2, the molecular weight of each polymer material is shown in parentheses.

As can be seen from Table 2, the organic electroluminescent device of the Inventive Example 1 having the three-layered structure has a higher luminous efficiency than that of the organic electroluminescent device of the Comparative Example 1 having the two layered structure.

In addition, the organic electroluminescent devices of the Inventive Example 1 and the Comparative Example 1 were tested for reliability. FIG. 7 is a diagram showing results of the reliability tests. The abscissa shows time, the ordinate shows luminance.

In the reliability tests, current was adjusted so that the initial luminance of each of the organic electroluminescent devices was set to 240 cd/m$^2$, and the organic electroluminescent devices were driven at a constant current to measure their luminance half-life. The current for the organic electroluminescent device of the Inventive Example was 0.28 mA, while the current for the organic electroluminescent device of the Comparative Example 1 was 3.00 mA with each device area being 2.8 mm$^2$.

As shown in FIG. 7, the luminance half-life of the organic electroluminescent device of the Comparative Example 1 was 400 hours. On the other hand, the luminance half-life of the organic electroluminescent device of the Inventive Example 1 was not less than 3800 hours. This shows that the organic electroluminescent device of the Inventive Example 1 having the three-layered structure has a much lengthened luminance half-life than that of the organic electroluminescent device of the Comparative Example 2 having the two-layered structure.

Comparative Example 2

In Comparative Example 2, an organic electroluminescent device having the three-layered structure shown in FIG. 1 was fabricated in a following method.

Similarly in the Inventive Example 1, a substrate 1 comprising an anode 2 made of ITO was used. As with the Inventive Example 1, PEDOT:PSS was initially formed to have a thickness of 40 nm on the anode 2 by spin coating, and baked at 180 degrees for ten minutes in the atmosphere, thus forming a hole injection layer 3.

Then, PF6-CVAP was formed to have a thickness of 40 nm on the hole injection layer 3 by spin coating, and baked at 80 degrees for five minutes in an atmosphere of nitrogen, thus forming a light emitting layer 4. At this time, the PF6-CVAP was used as a solution of o-dichlorobenzene.

MEH-PPV was subsequently formed to have a thickness of 40 nm by spin coating on the light emitting layer 4, thus forming an electron transport layer 5. At this time, the MEH-PPV was used as a solution of toluene. The electron transport layer 5 was formed without damage to the polymer film of the light emitting layer 4.

An electron injection layer 6 made of calcium in a thickness of 6 nm and a cathode 7 made of aluminum in a thickness of 200 nm were formed on the electron transport layer 5 by vacuum evaporation.

The repeating unit of the polymeric material forming the light emitting layer 4 and the repeating unit of the polymeric material forming the electron transport layer 5 include the same chemical structure (phenylenevinylene chemical structure).

Inventive Example 2

In Comparative Example 2, an organic electroluminescent device having the three-layered structure shown in FIG. 1 was fabricated in a following method.

Similarly in the Inventive Example 1, a glass substrate 1 comprising an anode 2 made of ITO was used. As with the Inventive Example 1, PEDOT:PSS was initially formed to have a thickness of 40 nm on the anode 2 by spin coating, and baked at 180 degrees for ten minutes in the atmosphere, thus forming a hole injection layer 3.

PF6-CVAP was subsequently formed to have a thickness of 40 nm on the hole injection layer 3 by spin coating, and baked at 80 degrees in an atmosphere of nitrogen, thus forming a light emitting layer 4. At this time, the PF6-CVAP was used as a solution of o-dichlorobenzene.

Then, PF8-DSB was formed to have a thickness of 40 nm on the light emitting layer 4 by spin coating, thus forming an electron transport layer 5 also serving as a hole blocking layer. At this time, the PF8-DEB was used as a solution of toluene. The electron transport layer 5 was formed without damage to the polymer film of the light emitting layer 4.

An electron injection layer 6 made of calcium in a thickness of 6 nm and a cathode 7 made of aluminum in a thickness of 20 nm were formed on the electron transport layer 5 by vacuum evaporation.

(Evaluation 2)

The organic electroluminescent devices of the Inventive Example 2 and Comparative Example 2 were measured for luminous efficiency. Table 3 shows materials of the light emitting layers 4 and electron transport layers 5, and measurement results of the luminous efficiencies for the organic electroluminescent devices of the Inventive Example 2 and Comparative Example 2.

TABLE 3

| | LIGHT EMITTING LAYER 4 | ELECTRON TRANSPORT LAYER 5 | LUMINOUS EFFICIENCY (cd/A) at 100 cd/m$^2$ |
| --- | --- | --- | --- |
| INVENTIVE EXAMPLE 2 | PF6-CVAP (57,000) (HOMO: −5.71 eV) | PF8-DSB (56,000) (HOMO: −5.57 eV) | 1.17 |
| COMPARATIVE EXAMPLE 2 | PF6-CVAP (57,000) (HOMO: −5.71 eV) | MEH-PPV (750,000) (HOMO: −5.17 eV) | 0.047 |

As can be seen from Table 3, the organic electroluminescent device of the Inventive Example 2 in which the material forming the light emitting layer 4, i.e., the lower layer, has a molecular weight greater than that of the material forming the electron transport layer 5, i.e., the upper layer, has a higher luminous efficiency than that of the organic electroluminescent device of the Comparative Example 2 in which the material forming the light emitting layer 4, the lower layer, has a molecular weight smaller than that of the material forming the electron transport layer 5, the upper layer.

It can also be seen that the organic electroluminescent device of the Inventive Example 2 in which the material forming the electron transport layer 5 has the hole blocking property in addition to the electron transport property, has a higher luminous efficiency than that of the organic electroluminescent device of the Comparative Example 2 in which the material forming the electron transport layer 5 fails to have the hole blocking property.

Figure 8:
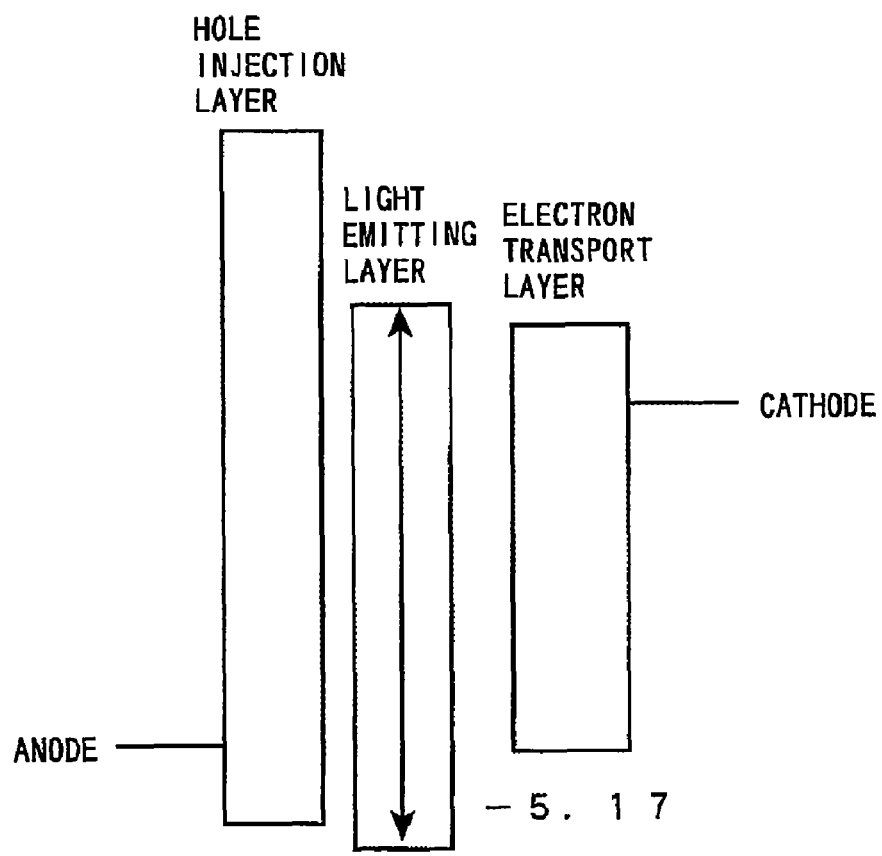
FIG. 8 is a schematic diagram showing energy levels of the lowest unoccupied molecular orbital (LUMO) and the highest occupied molecular orbital (HOMO) in the hole injection layer, light emitting layer, and electron transport layer of the organic electroluminescent device of Inventive Example 2.
Figure 9:
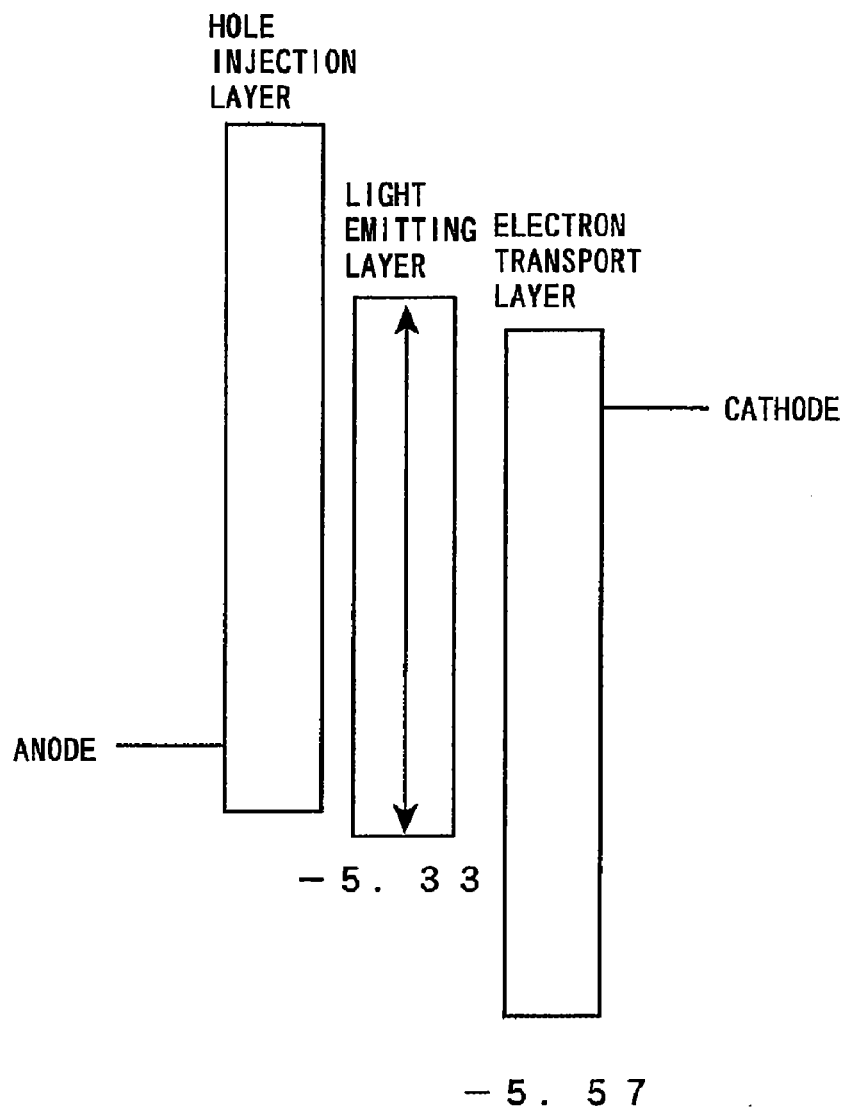
FIG. 9 is a schematic diagram showing energy levels of the lowest unoccupied molecular orbital (LUMO) and the highest occupied molecular orbital (HOMO) in the hole injection layer, light emitting layer, and electron transport layer of the organic electroluminescent device of Comparative Example 2.

FIG. 8 is a schematic diagram showing energy levels of the lowest unoccupied molecular orbital (LUMO) and the highest occupied molecular orbital (HOMO) in the hole injection layer 3, light emitting layer 4, and electron transport layer 5 of the organic electroluminescent device of the Inventive Example 2. FIG. 9 is a schematic diagram showing energy levels of the lowest unoccupied molecular orbital (LUMO)

and the highest occupied molecular orbital (HOMO) in the hole injection layer 3, light emitting layer 4, and electron transport layer 5 of the organic electroluminescent device of the Comparative Example 2.

As shown in FIG. 8, in the organic electroluminescent device of the Inventive Example 2, the energy level of the HOMO in the light emitting layer 4 is −5.33 eV while the energy level of the HOMO in the electron transport layer 5 is −5.17 eV. On the other hand, as shown in FIG. 9, in the organic electroluminescent device of the Comparative Example 2, the energy level of the HOMO in the hole injection layer 3 is −5.33 eV while the energy level of the HOMO in the electron transport layer 5 is −5.57 eV.

Accordingly, in the organic electroluminescent device of the Inventive Example 2, holes injected from the hole injection layer 3 into the light emitting layer 4 are prevented from passing through an energy barrier between the light emitting layer 4 and the electron transport layer 5 to the side of the cathode 7. This results in an appropriate balance between the electrons and holes in the light emitting layer 4, allowing efficient electron-hole recombination. As a result, high luminous efficiency is achieved.

Since no more than two layers could have been formed on the conventional organic electroluminescent device of the two-layered type, excessive holes flew into the light emitting layer, which disabled electron injection from keeping pace with hole injection. This prevents an appropriate balance between electrons and holes, resulting in a lower luminous efficiency than the luminous efficiency that should have originally been achieved.

Inventive Example 3

In Inventive Example 3, nine kinds of organic electroluminescent devices having light emitting layers 4 and electron transport layers 5 in different thicknesses were fabricated to evaluate luminescent characteristics. The organic electroluminescent devices in the Inventive Example 3 are similar to the organic electroluminescent device in the Inventive Example 1 in structure and fabrication method except in the thicknesses of the light emitting layers 4 and the electron transport layers 5.

Table 4 shows thicknesses of the light emitting layer 4 and the electron transport layer 5 of each of the nine kinds of organic electroluminescent devices, 1-1, 1-2, 1-2, 2-1, 2-2, 2-3, 3-1, 3-2, 3-3.

TABLE 4

| INVENTIVE EXAMPLE 3 | | LIGHT EMITTING LAYER THICKNESS (Å) | | |
|---|---|---|---|---|
|  |  | 140 | 260 | 620 |
| ELECTRON TRANSPORT LAYER THICKNESS (Å) | 160 | 1-1 | 2-1 | 3-1 |
|  | 380 | 1-2 | 2-2 | 3-2 |
|  | 660 | 1-3 | 2-3 | 3-3 |

(Evaluation 3)

The nine kinds of organic electroluminescent devices in the Inventive Example 3 were measured for luminous efficiency. Table 5 shows measurement results of the luminous efficiencies of the nine kinds of organic electroluminescent devices 1-1, 1-2, 1-2, 2-1, 2-2, 2-3, 3-1, 3-2, 3-3 in the Inventive Example 3.

TABLE 5

|  | LUMINOUS EFFICIENCY (cd/A) at 100 cd/m² |
|---|---|
| 1-1 | 0.23 |
| 1-2 | 1.55 |
| 1-3 | 3.65 |
| 2-1 | 0.52 |
| 2-2 | 1.54 |
| 2-3 | 2.92 |
| 3-1 | 1.94 |
| 3-2 | 2.43 |
| 3-3 | 1.95 |

As can be seen from Table 5, even the organic electroluminescent devices 1-2, 1-3, 2-2, 2-3, in which the electron transport layers 5 and the light emitting layers 4 have different thicknesses from those of the Inventive Example 1, provide higher luminous efficiencies than those of the organic electroluminescent devices of the Comparative Examples 1 and 2.

Inventive Example 4

In Inventive Example 4, an organic electroluminescent device having the same structure as that of the Inventive Example 2 was fabricated in the same method as that of the Inventive Example 2.

Inventive Example 5

In Inventive Example 5, an organic electroluminescent device having the three-layered structure shown in FIG. 1 was fabricated in a following method. The light emitting layer 4 is composed of two kinds of polymeric materials.

Similarly in the Inventive Example 1, a glass substrate 1 comprising an anode 2 made of ITO was used. As with the Inventive Example 1, PEDOT:PSS was initially formed to have a thickness of 40 nm on the anode 2 by spin coating, and baked at 180 degrees for ten minutes in the atmosphere, thus forming a hole injection layer 3.

PF6-CVAP with the addition of a 10 wt % of PF6-CVAP was subsequently formed to have a thickness of 40 nm on the hole injection layer 3 by spin coating, and baked at 80 degrees for five minutes in an atmosphere of nitrogen, thus forming a light emitting layer 4. At this time, the polymer forming the light emitting layer 4 was used as a solution of o-dichlorobenzene.

Then, PF8-DSB was formed to have a thickness of 40 nm on the light emitting layer 4 by spin coating, thus forming an electron transport layer 5 also serving as a hole blocking layer. At this time, the PF8-DEB was used as a solution of toluene. The electron transport layer 5 was formed without damage to the polymer film of the light emitting layer 4.

An electron injection layer 6 made of calcium in a thickness of 6 nm and a cathode 7 made of aluminum in a thickness of 200 nm were formed on the electron transport layer 5 also serving as the hole blocking layer by vacuum evaporation.

(Evaluation 4)

The organic electroluminescent devices of the Inventive Examples 4, 5 were measured for luminance half-life. Table 6 shows materials of the light emitting layers 4 and the electron transport layers 5, and measurement results of the luminance half-lives for the organic electroluminescent devices of the Inventive Examples 4, 5. Measurements were conducted with their initial luminances being set to 200 cd/m², the organic electroluminescent devices being driven at a constant current at room temperature. The device areas were each 2.8 mm².

TABLE 6

|  | LIGHT EMITTING LAYER 4 | ELECTRON TRANSPORT LAYER 5 | LUMINANCE HALF-LIFE |
|---|---|---|---|
| INVENTIVE EXAMPLE 4 | PF6-CVAP (57,000) (HOMO: −5.71 eV) | PF8-DSB (56,000) (HOMO: −5.57 eV) | 30 |
| INVENTIVE EXAMPLE 5 | MEH-PPV (750,000) (HOMO: −5.17 eV) PF6-CVAP (57,000) (HOMO: −5.71 eV) | PF8-DSB (56,000) (HOMO: −5.57 eV) | 600 |

As can be seen from Table 6, the organic electroluminescent device of the Inventive Example 5 including the light emitting layer 4 composed of two kinds of polymeric materials has a longer luminance half-life than that of the organic electroluminescent device of the Inventive Example 4 including the light emitting layer 4 composed of a single kind of polymeric material.

The organic electroluminescent device using the MEH-PPV with the addition of PF6-CVAP as the material for the light emitting layer 4, in particular, has a luminance half-life twice that of the organic electroluminescent device using the single MEH-PPV as the material for the light emitting layer 4, resulting in a substantial increase in luminance half-life.

Inventive Example 6

In Inventive Example 6, an organic electroluminescent device having the same structure as that of the Inventive Example 1 was fabricated in the same method as that of the Inventive Example 1.

Inventive Example 7

In Inventive Example 7, an organic electroluminescent device having the three-layered structure shown in FIG. 1 was fabricated in a following method. The electron transport layer 5 is composed of two kinds of polymeric materials.

Similarly in the Inventive Example 1, a glass substrate 1 comprising an anode 2 made of ITO was used. As with the Inventive Example 1, PEDOT:PSS was initially formed to have a thickness of 40 nm on the anode 2 by spin coating, and baked at 180 degrees for ten minutes in the atmosphere, thus forming a hole injection layer 3.

MEH-PPV was subsequently formed to have a thickness of 40 nm on the hole injection layer 3 by spin coating, and baked at 80 degrees for five minutes in an atmosphere of nitrogen, thus forming a light emitting layer 4. At this time, the polymer forming the light emitting layer 4 was used as a solution of o-dichlorobenzene.

Then, PF8-DSB with the addition of a 5 wt % of ZnBTZ was formed to have a thickness of 40 nm on the light emitting layer 4 by spin coating, thus forming an electron transport layer 5 also serving as a hole blocking layer. At this time, the polymeric material forming the electron transport layer 5 was used as a solution of toluene. The electron transport layer 5 was formed without damage to the polymer film of the light emitting layer 4.

An electron injection layer 6 made of calcium in a thickness of 6 nm and a cathode 7 made of aluminum in a thickness of 200 nm were formed on the electron transport layer 5 by vacuum evaporation.

(Evaluation 5)

The organic electroluminescent devices of the Inventive Examples 6, 7 were measured for luminous efficiency. Table 7 shows materials of the light emitting layers 4 and the electron transport layers 5, and measurement results of the luminous efficiencies for the organic electroluminescent devices of the Inventive Examples 6, 7.

TABLE 7

|  | LIGHT EMITTING LAYER 4 | ELECTRON TRANSPORT LAYER 5 | LUMINOUS EFFICIENCY (cd/A) at 100 cd/m² |
|---|---|---|---|
| INVENTIVE EXAMPLE 6 | MEH-PPV) (750,000) (HOMO: −5.17 eV) | PF8-DSB (56,000) (HOMO: −5.57 eV) | 2.6 |
| INVENTIVE EXAMPLE 7 | MEH-PPV (750,000) (HOMO: −5.17 eV) | PF8-DSB (56,000) (HOMO: −5.57 eV) ZnBTz (477) | 3 |

As can be seen from Table 7, the organic electroluminescent device of the Inventive Example 7 including the electron transport layer 5 composed of two kinds of materials has a higher luminous efficiency than that of the organic electroluminescent device of the Inventive Example 6 including the electron transport layer 5 composed of a single kind of polymeric material.

The organic electroluminescent device using the PF8-DSB with the addition of ZnBTZ as the material for the electron transport layer 5, in particular, showed a substantial increase in luminous efficiency, compared with the organic electroluminescent device using the single PF8-DSB as the material for the electron transport layer 5.

Inventive Example 8

In Inventive Example 8, an organic electroluminescent device having the three-layered structure shown in FIG. 1 was fabricated in a following method.

Similarly in the Inventive Example 1, a glass substrate 1 comprising an anode 2 made of ITO was used. As with the Inventive Example 1, PEDOT:PSS was initially formed to have a thickness of 40 nm on the anode 2 by spin coating, and baked at 180 degrees for ten minutes in the atmosphere, thus forming a hole injection layer 3.

MEH-PPV was subsequently formed to have a thickness of 40 nm on the hole injection layer 3 by spin coating, and baked at 80 degrees for five minutes in an atmosphere of nitrogen, thus forming a light emitting layer 4. At this time, the polymer forming the light emitting layer 4 was used as a solution of o-dichlorobenzene.

Then, PF8-MEHPPV was formed to have a thickness of 40 nm on the light emitting layer 4 by spin coating, thus forming an electron transport layer 5 also serving as a hole blocking layer. At this time, the polymeric material forming the electron transport layer 5 was used as a solution of toluene. The electron transport layer 5 was formed without damage to the polymer film of the light emitting layer 4.

An electron injection layer 6 made of calcium in a thickness of 6 nm and a cathode 7 made of aluminum in a thickness of 200 nm were formed on the electron transport layer 5 by vacuum evaporation.

The repeating unit of the polymeric material forming the light emitting layer 4 and the repeating unit of the polymeric material forming the electron transport layer 5 include the same chemical structure (phenylenevinylene chemical structure).

Inventive Example 9

In Inventive Example 9, an organic electroluminescent device having the three-layered structure shown in FIG. 1 was fabricated in a following method.

Similarly in the Inventive Example 1, a glass substrate 1 comprising an anode 2 made of ITO was used. As with the Inventive Example 1, PEDOT:PSS was initially formed to have a thickness of 40 nm on the anode 2 by spin coating, and baked at 180 degrees for ten minutes in the atmosphere, thus forming a hole injection layer 3.

MEH-PPV was subsequently formed to have a thickness of 40 nm on the hole injection layer 3 by spin coating, and baked at 80 degrees for five minutes in an atmosphere of nitrogen, thus forming a light emitting layer 4. At this time, the polymer forming the light emitting layer 4 was used as a solution of o-dichlorobenzene.

Then, PF8 was formed to have a thickness of 40 nm on the light emitting layer 4 by spin coating, thus forming an electron transport layer 5 also serving as a hole blocking layer. At this time, the polymeric material forming the electron transport layer 5 was used as a solution of toluene. The electron transport layer 5 was formed without damage to the polymer film of the light emitting layer 4.

An electron injection layer 6 made of calcium in a thickness of 6 nm and a cathode 7 made of aluminum in a thickness of 200 nm were formed on the electron transport layer 5 by vacuum evaporation.

The repeating unit of the polymeric material forming the light emitting layer 4 and the repeating unit of the polymeric material forming the electron transport layer 5 do not include the same chemical structure.

Inventive Example 10

In Inventive Example 10, an organic electroluminescent device having the three-layered structure shown in FIG. 1 was fabricated in a following method.

Similarly in the Inventive Example 1, a glass substrate 1 comprising an anode 2 made of ITO was used. As with the Inventive Example 1, PEDOT:PSS was initially formed to have a thickness of 40 nm on the anode 2 by spin coating, and baked at 180 degrees for ten minutes in the atmosphere, thus forming a hole injection layer 3.

MEH-PPV was subsequently formed to have a thickness of 40 nm on the hole injection layer 3 by spin coating, and baked at 80 degrees for five minutes in an atmosphere of nitrogen, thus forming a light emitting layer 4. At this time, the polymer forming the light emitting layer 4 was used as a solution of o-dichlorobenzene.

Then, PF8-Py was formed to have a thickness of 40 nm on the light emitting layer 4 by spin coating, thus forming an electron transport layer 5 also serving as a hole blocking layer. At this time, the polymeric material forming the electron transport layer 5 was used as a solution of toluene. The electron transport layer 5 was formed without damage to the polymer film of the light emitting layer 4.

An electron injection layer 6 made of calcium in a thickness of 6 nm and a cathode 7 made of aluminum in a thickness of 200 nm were formed on the electron transport layer 5 by vacuum evaporation.

The repeating unit of the polymeric material forming the light emitting layer 4 and the repeating unit of the polymeric material forming the electron transport layer 5 do not include the same chemical structure.

(Evaluation 6)

The organic electroluminescent devices of the Inventive Examples 8, 9, 10 were measured for luminous efficiency. Table 8 shows materials of the light emitting layers 4 and the electron transport layers 5, and measurement results of the luminous efficiencies for the organic electroluminescent devices of the Inventive Examples 8, 9, 10.

TABLE 8

|  | LIGHT EMITTING LAYER 4 | ELECTRON TRANSPORT LAYER 5 | LUMINOUS EFFICIENCY (cd/A) at 100 cd/m$^2$ |
|---|---|---|---|
| INVENTIVE EXAMPLE 8 | MEH-PPV (750,000) (HOMO: −5.17 eV) | PF8-MEHPPV) (86,000) (HOMO: −5.4 eV) | 2.16 |
| INVENTIVE EXAMPLE 9 | MEH-PPV (750,000) (HOMO: −5.17 eV) | PF8 (80,000) (HOMO: −5.84 eV) | 2.14 |
| INVENTIVE EXAMPLE 10 | MEH-PPV (750,000) (HOMO: −5.17 eV) | PF8-Py (80,000) (HOMO: −5.79 eV) | 2.11 |

As can be seen from Table 8, the organic electroluminescent devices of the Inventive Examples 8, 9, 10 using the PF8-MEHPPV, PF8, and PF8-Py as the materials forming the respective electron transport layers 5 also provide high luminous efficiencies, similarly to the case of the Inventive Example 1 using the PF8-DSB as the material for the electron transport layer 5, with the molecular weights of the respective light emitting layers 4 being greater than the molecular weights of the respective electron transport layers 5.

In addition, the organic electroluminescent devices 8, 9, 10 in which the materials forming the electron transport layers 5 have the hole blocking property in addition to the electron transport property proved to have higher luminous efficiencies than that of the organic electroluminescent device of the Comparative Example 2 in which the material forming the electron transport layer 5 fails to have the hole blocking property.

Furthermore, the organic electroluminescent device of the Inventive Example 8 in which the repeating unit of the polymeric material forming the light emitting layer 4 and the repeating unit of the polymeric material forming the electron transport layer 5 include the same chemical structure (phenylenevinylene structure), proved to have a higher luminous efficiency than those of the organic electroluminescent devices of the Inventive Examples 9, 10 in which the repeating unit of the polymeric material forming the light emitting layer 4 and the repeating unit of the polymeric material forming the electron transport layer 5 do not include the same chemical structure.

Inventive Example 11

In Inventive Example 11, an organic electroluminescent device having the three-layered structure shown in FIG. 1 was fabricated in a following method.

Similarly in the Inventive Example 1, a glass substrate 1 comprising an anode 2 made of ITO was used. As with the Inventive Example 1, PEDOT:PSS was initially formed to have a thickness of 40 nm on the anode 2 by spin coating, and baked at 180 degrees for ten minutes in the atmosphere, thus forming a hole injection layer 3.

PF8-MEHPPV was subsequently formed to have a thickness of 40 nm on the hole injection layer 3 by spin coating, and baked at 80 degrees for five minutes in an atmosphere of nitrogen, thus forming a light emitting layer 4. At this time, the polymer forming the light emitting layer 4 was used as a solution of o-dichlorobenzene.

Then, PF8-DSB was formed to have a thickness of 40 nm on the light emitting layer 4 by spin coating, thus forming an electron transport layer 5 also serving as a hole blocking layer. At this time, the polymeric material forming the electron transport layer 5 was used as a solution of toluene. The electron transport layer 5 was formed without damage to the polymer film of the light emitting layer 4.

An electron injection layer 6 made of calcium in a thickness of 6 nm and a cathode 7 made of aluminum in a thickness of 200 nm were formed on the electron transport layer 5 by vacuum evaporation.

(Evaluation 7)

The organic electroluminescent device of the Inventive Example 11 was measured for luminous efficiency. Table 9 shows materials of the light emitting layer 4 and the electron transport layer 5, and a measurement result of the luminous efficiency for the organic electroluminescent device of the Inventive Example 11.

TABLE 9

|  | LIGHT EMITTING LAYER 4 | ELECTRON TRANSPORT LAYER 5 | LUMINOUS EFFICIENCY (cd/A) at 100 cd/m$^2$ |
|---|---|---|---|
| INVENTIVE EXAMPLE 11 | PF8-MEHPPV (86,000) (HOMO: −5.4 eV) | PF8-DSB (56,000) (HOMO: −5.57 eV) | 1.1 |

As can be seen from Table 9, the organic electroluminescent device of the Inventive Example 11 using the PF8-MEHPPV for the material forming the light emitting layer 4 also provides a high luminous efficiency, similarly to the case of the Inventive Example 1 using the MEH-PPV as the material for the light emitting layer 4, with the molecular weight of the light emitting layer 4 being greater than the molecular weight of the electron transport layer 5.

Inventive Example 12

In Inventive Example 12, an organic electroluminescent device having the three-layered structure shown in FIG. 1 was fabricated in a following method. The light emitting layer 4 is composed of two kinds of polymeric materials.

Similarly in the Inventive Example 1, a glass substrate 1 comprising an anode 2 made of ITO was used. As with the Inventive Example 1, PEDOT:PSS was initially formed to have a thickness of 40 nm on the anode 2 by spin coating, and baked at 180 degrees for ten minutes in the atmosphere, thus forming a hole injection layer 3.

MEH-PPV with the addition of a 10 wt % of BDPAP-CNMEHPPV was subsequently formed to have a thickness of 40 nm on the hole injection layer 3 by spin coating, and baked at 80 degrees for five minutes in an atmosphere of nitrogen, thus forming a light emitting layer 4. At this time, the polymer forming the light emitting layer 4 was used as a solution of o-dichlorobenzene.

Then, PF8-DSB was formed to have a thickness of 40 nm on the light emitting layer 4 by spin coating, thus forming an electron transport layer 5 also serving as a hole blocking layer. At this time, the PF8-DSB was used as a solution of toluene. The electron transport layer 5 was formed without damage to the polymer film of the light emitting layer 4.

An electron injection layer 6 made of calcium in a thickness of 6 nm and a cathode 7 made of aluminum in a thickness of 200 nm were formed on the electron transport layer 5 by vacuum evaporation.

Comparative Example 3

An organic electroluminescent device having the three-layered structure shown in FIG. 1 was fabricated in a following method. The light emitting layer 4 is composed of a single kind of polymeric material.

Similarly in the Inventive Example 1, a glass substrate 1 comprising an anode 2 made of ITO was used. As with the Inventive Example 1, PEDOT:PSS was initially formed to have a thickness of 40 nm on the anode 2 by spin coating, and baked at 180 degrees for ten minutes in the atmosphere, thus forming a hole injection layer 3.

BDPAP-CNMEHPPV was subsequently formed to have a thickness of 40 nm on the hole injection layer 3 by spin coating, and baked at 80 degrees for five minutes in an atmosphere of nitrogen, thus forming a light emitting layer 4. At this time, the polymer forming the light emitting layer 4 was used as a solution of o-dichlorobenzene.

Then, PF8-DSB was formed to have a thickness of 40 nm on the light emitting layer 4 by spin coating, thus forming an electron transport layer 5 also serving as a hole blocking layer. At this time, the PF8-DSB was used as a solution of toluene. The electron transport layer 5 was formed without damage to the polymer film of the light emitting layer 4.

An electron injection layer 6 made of calcium in a thickness of 6 nm and a cathode 7 made of aluminum in a thickness of 200 nm were formed on the electron transport layer 5 by vacuum evaporation.

(Evaluation 8)

The organic electroluminescent devices of the Inventive Example 12 and Comparative Example 3 were measured for luminous efficiency. Table 10 shows materials of the light emitting layers 4 and the electron transport layers 5, and measurement results of the luminous efficiencies for the organic electroluminescent devices of the Inventive Example 12 and Comparative Example 3.

TABLE 10

|  | LIGHT EMITTING LAYER 4 | ELECTRON TRANSPORT LAYER 5 | LUMINOUS EFFICIENCY (cd/A) at 100 cd/m$^2$ |
|---|---|---|---|
| INVENTIVE EXAMPLE 12 | MEH-PPV (750,000) (HOMO: −5.17 eV) BDPAP-CNMEHPPV (30,000) | PF8-DSB (56,000) (HOMO: −5.57 eV) | 1.9 |
| COMPARATIVE EXAMPLE 3 | BDPAP-CNMEHPPV (30,000) | PF8-DSB (56,000) (HOMO: −5.57 eV) | 0.8 |

As can be seen from Table 10, the organic electroluminescent device of the Inventive Example 12 including the light emitting layer 4 composed of two kinds of materials has a higher luminous efficiency than that of the organic electroluminescent device of the Comparative Example 3 including the light emitting layer 4 composed of a single kind of polymeric material.

The organic electroluminescent device using the MEH-PPV with the addition of a 10 wt % of BDPAP-CNMEHPPV as the material for the light emitting layer 4, in particular, showed a substantial increase in luminous efficiency, compared with the organic electroluminescent device using the single BDPAP-CNMEHPPV as the material for the light emitting layer 4.

Furthermore, it was proved that higher luminous efficiency can be provided when the molecular weight of at least one kind of the materials forming the light emitting layer 4, i.e., the lower layer, is greater than the molecular weight of the material of the electron transport layer 5, i.e., the upper layer.

Inventive Example 13

In Inventive Example 13, an organic electroluminescent device having the three-layered structure shown in FIG. 2 was fabricated in a following method.

Similarly in the Inventive Example 1, a glass substrate 1 comprising an anode 2 made of ITO was used. As with the Inventive Example 1, PEDOT:PSS was initially formed to have a thickness of 40 nm on the anode 2 by spin coating, and baked at 180 degrees for ten minutes in the atmosphere, thus forming a hole injection layer 3.

PVCz was subsequently formed to have a thickness of 40 nm on the hole injection layer 3 by spin coating, and baked at 80 degrees for five minutes in an atmosphere of nitrogen, thus forming a hole transport layer 8 also serving as an electron blocking layer. At this time, the PVCz was used as a solution of o-dichlorobenzene (dielectric constant: 6.828).

Then, PF8-SB 10% was formed to have a thickness of 70 nm on the hole transport layer 8 by spin coating, thus forming a light emitting layer 4. At this time, the PF8-SB 10% was used as a solution of xylene (dielectric constant: 2.274 to 2.562). The light emitting layer 4 was formed without damage to the polymer film of the hole transport layer 8.

After that, an electron injection layer 6 made of calcium in a thickness of 6 nm and a cathode 7 made of aluminum in a thickness of 200 nm were formed on the electron transport layer 5 by vacuum evaporation.

Inventive Example 14

In Inventive Example 14, an organic electroluminescent device having the three-layered structure shown in FIG. 2 was fabricated in a following method.

Similarly in the Inventive Example 1, a glass substrate 1 comprising an anode 2 made of ITO was used. As with the Inventive Example 1, PEDOT:PSS was initially formed to have a thickness of 40 nm on the anode 2 by spin coating, and baked at 180 degrees for ten minutes in the atmosphere, thus forming a hole injection layer 3.

PVCz with the addition of a 50 wt % of PF8-TPA was subsequently formed to have a thickness of 25 nm on the hole injection layer 3 by spin coating, and baked at 80 degrees for five minutes in an atmosphere of nitrogen, thus forming a hole transport layer 8 also serving as an electron blocking layer. At this time, the PVCz was used as a solution of o-dichlorobenzene (dielectric constant: 6.828).

Then, PF8-BT (10%) was formed to have a thickness of 70 nm on the hole transport layer 8 by spin coating, thus forming a light emitting layer 4. At this time, the PF8-BT (10%) was used as a solution of xylene (dielectric constant: 2.274 to 2.562). The light emitting layer 4 was formed without damage to the polymer film of the hole transport layer 8.

After that, an electron injection layer 6 made of calcium in a thickness of 6 nm and a cathode 7 made of aluminum in a thickness of 200 nm were formed on the electron transport layer 5 by vacuum evaporation.

Comparative Example 4

In Comparative Example 4, an organic electroluminescent device having the two-layered structure shown in FIG. 2 was fabricated in a following method.

Similarly in the Inventive Example 1, a glass substrate 1 comprising an anode 2 made of ITO was used. As with the Inventive Example 1, PEDOT:PSS was initially formed to have a thickness of 40 nm on the anode 2 by spin coating, and baked at 180 degrees for ten minutes in the atmosphere, thus forming a hole injection layer 3.

PF8-SB (10%) was subsequently formed to have a thickness of 70 nm on the hole injection layer 3 by spin coating, thus forming a light emitting layer 4. At this time, the PF8-SB (10%) was used as a solution of xylene (dielectric constant: 2.274 to 2.562). The light emitting layer 4 was formed without damage to the polymer film of the hole transport layer 8.

An electron injection layer 6 made of calcium in a thickness of 6 nm and a cathode 7 made of aluminum in a thickness of 200 nm were formed on the light emitting layer 4 by vacuum evaporation.

(Evaluation 9)

The organic electroluminescent devices of the Inventive Examples 13, 14 and the Comparative Example 4 were measured for luminous efficiency. Table 11 shows materials of the hole transport layers 8 and the light emitting layers 4, and the luminous efficiencies for the organic electroluminescent devices of the Inventive Examples 13, 14 and the Comparative Example 4.

TABLE 11

| | HOLE TRANSPORT LAYER 8 | LIGHT EMITTING LAYER 4 | LUMINOUS EFFICIENCY (cd/A) at 100 cd/m$^2$ |
|---|---|---|---|
| INVENTIVE EXAMPLE 13 | PVCz (1,000,000) (LUMO: −2.10 eV) | PF8-SB (10%) (860,000) (LUMO: −2.94 eV) | 1.2 |
| INVENTIVE EXAMPLE 14 | PVCz (1,000,000) (LUMO: −2.10 ev) PF8-TPA (1,000,000) (LUMO: −2.58 eV) | PF8-BT (10%) (440,000) (LUMO: −3.22 eV) | 5.9 |
| COMPARATIVE EXEMPLE 4 | — | PF8-SB (10%) (860,000) (LUMO: −2.94 eV) | 0.7 |

As can be seen from Table 11, the organic electroluminescent devices of the Inventive Examples 13, 14 having the three-layered structure have higher luminous efficiencies than that of the organic electroluminescent device of the Comparative Example 4 having the two-layered structure.

In addition, it was proved that higher luminous efficiency can be provided when the molecular weight of at least one kind of one or more materials forming the hole electron transport layer 8, i.e., the lower layer, is greater than the molecular weight of the material of the light emitting layer 4, i.e., the upper layer.

Furthermore, the organic electroluminescent devices of the Inventive Examples 13, 14 in which the materials forming the hole transport layers 8 have the hole transport property in addition to the electron blocking property, proved to have higher luminous efficiencies than that of the organic electroluminescent device of the Comparative Example 4 without a hole transport layer 8.

Furthermore, the organic electroluminescent device of the Inventive Example 14 in which the hole transport layer 8 is composed of two kinds of materials proved to have a higher luminous efficiency than that of the organic electroluminescent device of the Inventive Example 13 in which the hole transport layer 8 is composed of a single kind of polymeric material.

The organic electroluminescent device using the PVCz with the addition of a 50 wt % of PF8-TPA as the material for the hole transport layer 8, in particular, showed a substantial increase in luminous efficiency, compared with the organic electroluminescent device using the PVCz as the material for the hole transport layer 8.

Inventive Example 15

In Inventive Example 15, an organic electroluminescent device having the three-layered structure shown in FIG. 3 was fabricated in a following method.

Similarly in the Inventive Example 1, a glass substrate 1 comprising an anode 2 made of ITO was used. As with the Inventive Example 1, PEDOT:PSS was initially formed to have a thickness of 40 nm on the anode 2 by spin coating, and baked at 180 degrees for ten minutes in the atmosphere, thus forming a hole injection layer 3.

PVCz was subsequently formed to have a thickness of 25 nm on the hole injection layer 3 by spin coating, and baked at 80 degrees for five minutes in an atmosphere of nitrogen, thus forming a hole transport layer 8 also serving as an electron blocking layer. At this time, the PVCz was used as a solution of o-dichlorobenzene (dielectric constant: 6.828).

Then, PF8-SB 10% was formed to have a thickness of 70 nm on the hole transport layer 8 by spin coating, thus forming a light emitting layer 4. At this time, the PF8-SB 10% was used as a solution of xylene (dielectric constant: 2.274 to 2.562). The light emitting layer 4 was formed without damage to the polymer film of the hole transport layer 8.

After that, an electron injection layer 6a made of lithium fluoride in a thickness of 1 nm, a cathode 7a made of calcium in a thickness of 6 nm, and a protective layer 9 made of aluminum in a thickness of 200 nm were formed on the light emitting layer 4 by vacuum evaporation.

(Evaluation 10)

The organic electroluminescent device of the Inventive Example 15 was measured for luminous efficiency. Table 12 shows materials of the hole transport layer 8 and the light emitting layer 4, and a measurement result of the luminous efficiency for the organic electroluminescent device of the Inventive Example 15.

TABLE 12

| | HOLE TRANSPORT LAYER 8 | LIGHT EMITTING LAYER 4 | LUMINOUS EFFICIENCY (cd/A) at 100 cd/m$^2$ |
|---|---|---|---|
| INVENTIVE EXAMPLE 15 | PVCz (1,000,000) (LUMO: −2.10 eV) | PF8-SB (10%) (860,000) (LUMO: −2.94 eV) | 1.5 |

As can be seen from Table 12, the organic electroluminescent device of the Inventive Example 15 in which the electron transport layer 6a contains an alkali metal, lithium, has improved electron injection property, resulting in a higher luminous efficiency than that of the organic electroluminescent device of the Inventive Example 13 in which the electron injection layer 6 is made of calcium.

(Evaluation)

Table 13 shows materials of the upper and lower layers, molecular weights of the materials of the upper and lower layers, molecular weight ratios thereof, and luminous efficiencies thereof for the organic electroluminescent devices of the Inventive Examples 1 to 15 and Comparative Examples 1 to 3.

Note that in Table 13, the lower layers and upper layers are the light emitting layers 4 and electron transport layers 5, respectively, in the Inventive Examples 1 to 12 and Comparative Examples 1 to 3 while the lower layers and upper layers are the hole transport layers 8 and the light emitting layers 4, respectively, in the Inventive Examples 13 to 15. Note also that the molecular weight ratio means a ratio of the molecular weight of a lower layer material to the molecular weight of an upper layer material.

TABLE 13

| | LOWER LAYER | UPPER LAYER | LOWER LAYER MOLECULAR WEIGHT | UPPER LAYER MOLECULAR WEIGHT | MOLECULAR WEIGHT RATIO | LUMINOUS EFFICIENCY (cd/A) |
|---|---|---|---|---|---|---|
| COMPARATIVE EXAMPLE 1 | MEH-PPV | | 750000 | | | 0.1 |
| COMPARATIVE EXAMPLE 2 | PF6-CVAP | MEH-PPV | 57000 | 750000 | 0.08 | 0.047 |
| COMPARATIVE EXAMPLE 3 | BDPAP-CNMEHPPV | PF8-DSB | 30000 | 56000 | 0.54 | 0.8 |
| INVENTIVE EXAMPLE 1 | MEH-PPV | PF8-DSB | 750000 | 56000 | 13.39 | 2.6 |
| INVENTIVE EXAMPLE 2 | PF6-CVAP | PF8-DSB | 57000 | 56000 | 1.02 | 1.17 |
| INVENTIVE EXAMPLE 3 | MEH-PPV | PF8-DSB | 750000 | 56000 | 13.39 | 0.23~3.65 |
| INVENTIVE EXAMPLE 4 | PF6-CVAP | PF8-DSB | 57000 | 56000 | 13.39 | |
| INVENTIVE EXAMPLE 5 | MEH-PPV (PF6-CVAP) | PF8-DSB | 750000 | 56000 | 13.39 | |
| INVENTIVE EXAMPLE 6 | MEH-PPV | PF8-DSB | 750000 | 56000 | 13.39 | 2.6 |
| INVENTIVE EXAMPLE 7 | MEH-PPV | PF8-DSB (ZnBTz) | 750000 | 56000 | 13.39 | 3 |
| INVENTIVE EXAMPLE 8 | MEH-PPV | PF8-MEHPPV | 750000 | 86000 | 8.72 | 2.16 |
| INVENTIVE EXAMPLE 9 | MEH-PPV | PF8 | 750000 | 80000 | 9.38 | 2.14 |
| INVENTIVE EXAMPLE 10 | MEH-PPV | PF8-Py | 750000 | 80000 | 9.38 | 2.11 |
| INVENTIVE EXAMPLE 11 | PF8-MEHPPV | PF8-DSB | 86000 | 56000 | 1.54 | 1.1 |
| INVENTIVE EXAMPLE 12 | MEH-PPV (BDPAP-CNMEHPPV) | PF8-DSB | 750000 | 56000 | 13.39 | 1.9 |

TABLE 13-continued

| | LOWER LAYER | UPPER LAYER | LOWER LAYER MOLECULAR WEIGHT | UPPER LAYER MOLECULAR WEIGHT | MOLECULAR WEIGHT RATIO | LUMINOUS EFFICIENCY (cd/A) |
|---|---|---|---|---|---|---|
| INVENTIVE EXAMPLE 13 | PVCz | PF8-SB (10%) | 1000000 | 860000 | 6.25 | 1.2 |
| INVENTIVE EXAMPLE 14 | PVCz (PF8-TPA) | PF8-BT (10%) | 1000000 | 440000 | 8.33 | 5.9 |
| INVENTIVE EXAMPLE 15 | PVCz (PF8-TPA) | PF8-SB (10%) | 1000000 | 860000 | 6.25 | 1.5 |

Figure 10:
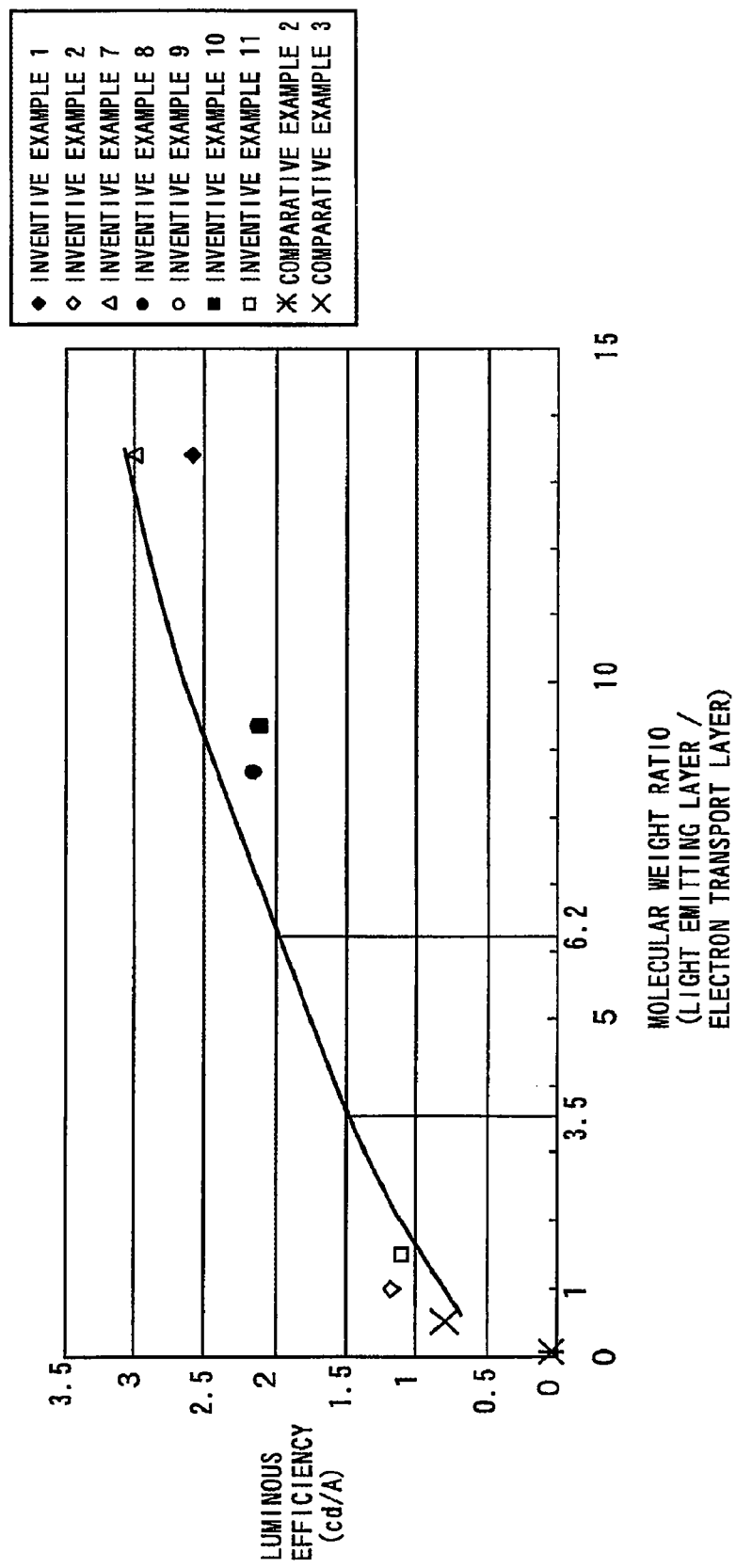
FIG. 10 is a diagram showing the relationships between the molecular weight ratios and the luminous efficiencies of the organic electroluminescent devices of Inventive Examples 1, 2, 7 to 11 and Comparative Examples 2, 3.

FIG. 10 is a diagram showing the relationships between the molecular weight ratios and luminous efficiencies of the organic electroluminescent devices of the Inventive Examples 1, 2, 7 to 11 and Comparative Examples 2, 3.

It can be seen from Table 13 and FIG. 10 that the luminous efficiencies increase as the molecular weight ratios become greater. In order to satisfy the requirements of a full-color display using organic electroluminescent devices of three colors, luminous efficiencies are preferably not less than 1.5 cd/A, more preferably not less than 2.0 cd/A. According to FIG. 10, molecular weight ratios are thus preferably not less than 3.5, more preferably not less than 6.2.

The invention claimed is:

1. An organic electroluminescent device, comprising:
a substrate;
a first electrode;
a first organic layer formed by a first polymeric material;
a second organic layer formed by a second polymeric material; and
a second electrode in this order,
wherein,
the repeating unit of said first polymeric material and the repeating unit of said second polymeric material include a common chemical structure, and
the ratio of the weight average molecular weight of said first polymeric material to the weight average molecular weight of said second polymeric material is not less than 3.5.

2. The organic electroluminescent device according to claim 1, wherein said first organic layer has luminescent property, and said second organic layer has carrier transport property.

3. The organic electroluminescent device according to claim 2, wherein said second polymeric material has a property of transporting carriers of a first electric charge as well as a property of blocking carriers of a second electric charge opposite to said first electric charge.

4. The organic electroluminescent device according to claim 1, wherein said first organic layer has carrier transport property, and said second organic layer has luminescent property.

5. The organic electroluminescent device according to claim 4, wherein said first polymeric material has a property of transporting carriers of a first electric charge as well as a property of blocking carriers of a second electric charge opposite to said first electric charge.

6. The organic electroluminescent device according to claim 1, wherein the ratio of the weight average molecular weight of said first polymeric material to the weight average molecular weight of said second polymeric material is not less than 6.2.

7. The organic electroluminescent device according to claim 1, wherein said first polymeric material includes a plurality of kinds of polymeric materials.

8. The organic electroluminescent device according to claim 1, wherein said second polymeric material includes a plurality of kinds of polymeric materials.

9. A method of fabricating an organic electroluminescent device comprising a first organic layer and a second organic layer between a first electrode and a second electrode, the method comprising the steps of:
preparing a solution of a first polymeric material by dissolving a first polymeric material in a first organic solvent;
preparing a solution of a second polymeric material by dissolving a second polymeric material in a second organic solvent;
forming said first organic layer using the solution of said first polymeric material; and
forming said second organic layer on said first organic layer using the solution of said second polymeric material,
wherein the dielectric constant of said first organic solvent is greater than the dielectric constant of said second organic solvent, and
the ratio of the weight average molecular weight of said first polymeric material to the weight average molecular weight of said second polymeric material is not less than 3.5.

10. The method of fabricating an organic electroluminescent device according to claim 9, wherein a difference between the dielectric constant of said first organic solvent and the dielectric constant of said second organic solvent is not less than two.

11. The method of fabricating an organic electroluminescent device according to claim 9, wherein said first organic layer has luminescent property, and said second organic layer has carrier transport property.

12. The method of fabricating an organic electroluminescent device according to claim 11, wherein said second polymeric material has a property of transporting carriers of a first electric charge as well as a property of blocking carriers of a second electric charge opposite to said first electric charge.

13. The method of fabricating an organic electroluminescent device according to claim 9, wherein said first organic layer has carrier transport property, and said second organic layer has luminescent property.

14. The method of fabricating an organic electroluminescent device according to claim 13, wherein said first polymeric material has a property of transporting carriers of a first electric charge as well as a property of blocking carriers of a second electric charge opposite to said first electric charge.

15. The method of fabricating an organic electroluminescent device according to claim 9, wherein the ratio of the weight average molecular weight of said first polymeric material to the weight average molecular weight of said second polymeric material is not less than 6.2.

16. The method of fabricating an organic electroluminescent device according to claim 9, wherein the repeating unit of said first polymeric material and the repeating unit of said second polymeric material includes a common chemical structure.

17. An organic electroluminescent device, comprising:
   a substrate;
   a first electrode;
   a first organic layer formed by a first polymeric material;
   a second organic layer formed by a second polymeric material; and
   a second electrode in this order,
   wherein the repeating unit of said first polymeric material and the repeating unit of said second polymeric material include a common chemical structure, and
   the ratio of the weight average molecular weight of said first polymeric material to the weight average molecular weight of said second polymeric material is not less than 3.5.

* * * * *